(12) United States Patent
Pang et al.

(10) Patent No.: US 9,406,690 B2
(45) Date of Patent: Aug. 2, 2016

(54) CONTACT FOR VERTICAL MEMORY WITH DOPANT DIFFUSION STOPPER AND ASSOCIATED FABRICATION METHOD

(71) Applicant: SanDisk Technologies Inc., Plano, TX (US)

(72) Inventors: Liang Pang, Fremont, CA (US); Jayavel Pachamuthu, San Jose, CA (US); Yingda Dong, San Jose, CA (US)

(73) Assignee: SanDisk Technologies LLC, Plano, TX (US)

( * ) Notice: Subject to any disclaimer, the term of this patent is extended or adjusted under 35 U.S.C. 154(b) by 0 days.

(21) Appl. No.: 14/572,146

(22) Filed: Dec. 16, 2014

(65) Prior Publication Data
US 2016/0172368 A1 Jun. 16, 2016

(51) Int. Cl.
*H01L 27/115* (2006.01)
*H01L 27/105* (2006.01)
*H01L 27/112* (2006.01)
*H01L 29/66* (2006.01)

(52) U.S. Cl.
CPC ...... *H01L 27/11556* (2013.01); *H01L 27/1052* (2013.01); *H01L 27/11582* (2013.01); *H01L 27/1128* (2013.01); *H01L 27/11524* (2013.01); *H01L 27/11578* (2013.01); *H01L 29/66833* (2013.01)

(58) Field of Classification Search
None
See application file for complete search history.

(56) References Cited

U.S. PATENT DOCUMENTS

| | | | |
|---|---|---|---|
| 5,369,304 A | 11/1994 | Lesk et al. | |
| 5,759,905 A | 6/1998 | Pan et al. | |
| 6,417,099 B1 | 7/2002 | Tsai et al. | |
| 6,819,695 B1 | 11/2004 | Akulova et al. | |
| 8,923,072 B2* | 12/2014 | Oh | G11C 16/14 257/314 |
| 9,130,038 B2* | 9/2015 | Shim | H01L 27/11582 |
| 9,190,416 B2* | 11/2015 | Lee | H01L 29/66833 |
| 2005/0287811 A1* | 12/2005 | Inukai | H01L 21/31144 438/700 |

(Continued)

OTHER PUBLICATIONS

Katsumata, Ryota, et al., "Pipe-shaped BiCS Flash Memory with 16 Stacked Layers and Multi-Level-Cell Operation for Ultra High Density Storage Devices," Symposium on VLSI Technology Digest of Technical Papers, Jun. 2009, 2 pages.

*Primary Examiner* — Andres Munoz
(74) *Attorney, Agent, or Firm* — Vierra Magen Marcus LLP

(57) ABSTRACT

A memory device and corresponding fabrication method prevent undesired diffusion of dopants from a silicon cap of a vertical NAND string to a channel film of the NAND string. Initially, a memory hole is provided in a stack of alternating control gate layers and dielectric layers. The memory hole is filled with annular films and a dielectric core filler. The dielectric core filler is etched back from a top of the memory hole to a topmost control gate layer, forming a void. A dopant stopper liner is deposited in the void before depositing n+ doped silicon which forms the silicon cap. The dopant stopper liner can be a conductive material such as metal or polysilicon doped with carbon. A conductive via is then formed above, and aligned with, the top of the silicon cap. A bit line may be formed over the conductive via.

9 Claims, 27 Drawing Sheets

(56) References Cited

U.S. PATENT DOCUMENTS

| | | | | |
|---|---|---|---|---|
| 2009/0108333 A1* | 4/2009 | Kito | ............... | H01L 27/115 257/324 |
| 2011/0204433 A1* | 8/2011 | Fujita | ............... | H01L 27/11524 257/326 |
| 2011/0298013 A1* | 12/2011 | Hwang | ............... | H01L 27/11551 257/208 |
| 2012/0299076 A1* | 11/2012 | Yoo | ............... | H01L 29/66833 257/314 |
| 2013/0069152 A1* | 3/2013 | Lee | ............... | H01L 29/66833 257/335 |
| 2013/0100741 A1* | 4/2013 | Choi | ............... | H01L 27/11565 365/185.18 |
| 2013/0107602 A1* | 5/2013 | Oh | ............... | H01L 27/11556 365/51 |
| 2013/0161731 A1* | 6/2013 | Bin | ............... | H01L 29/78 257/329 |
| 2013/0322174 A1 | 12/2013 | Li et al. | | |
| 2015/0340370 A1* | 11/2015 | Kim | ............... | H01L 27/1157 365/185.18 |

\* cited by examiner

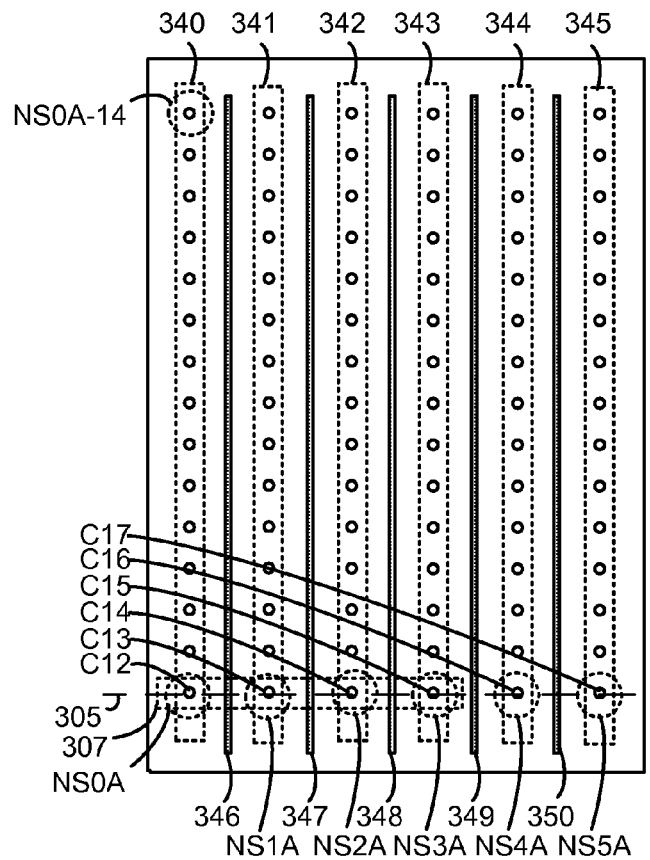
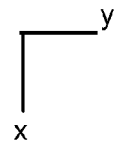
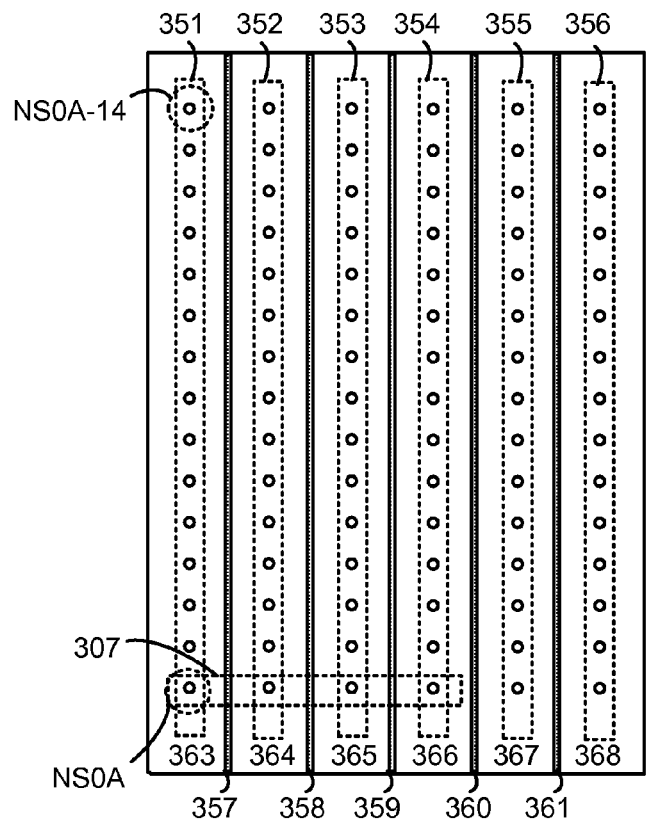
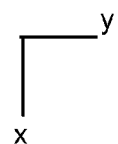

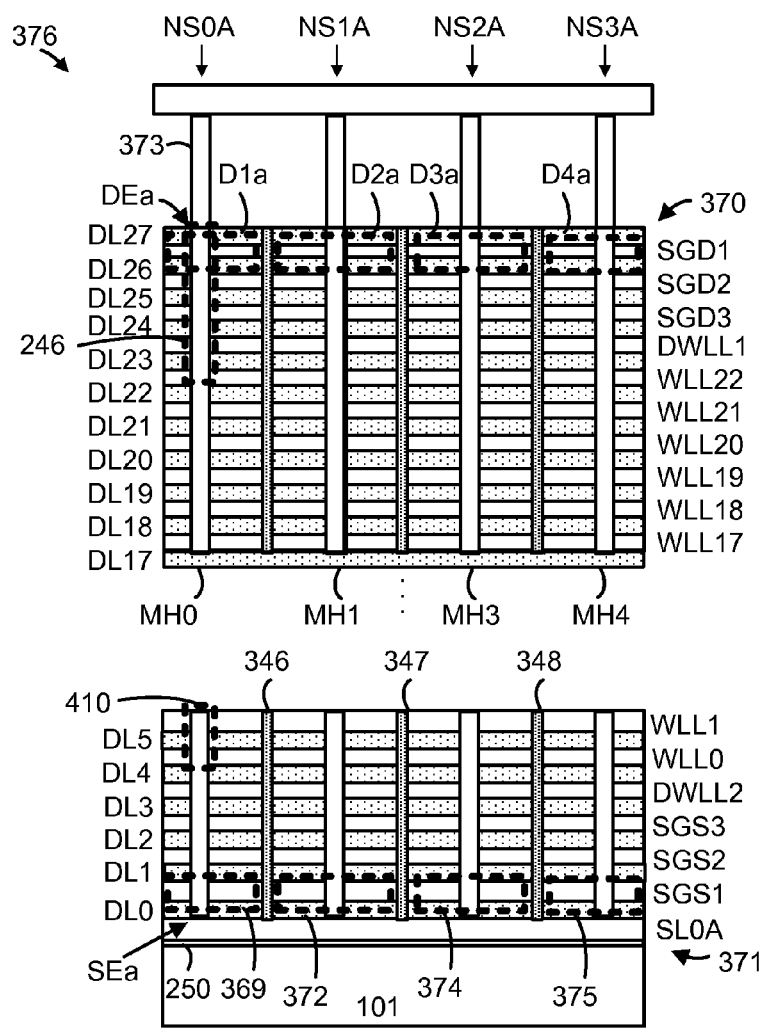
Fig. 3C1
Fig. 3C2

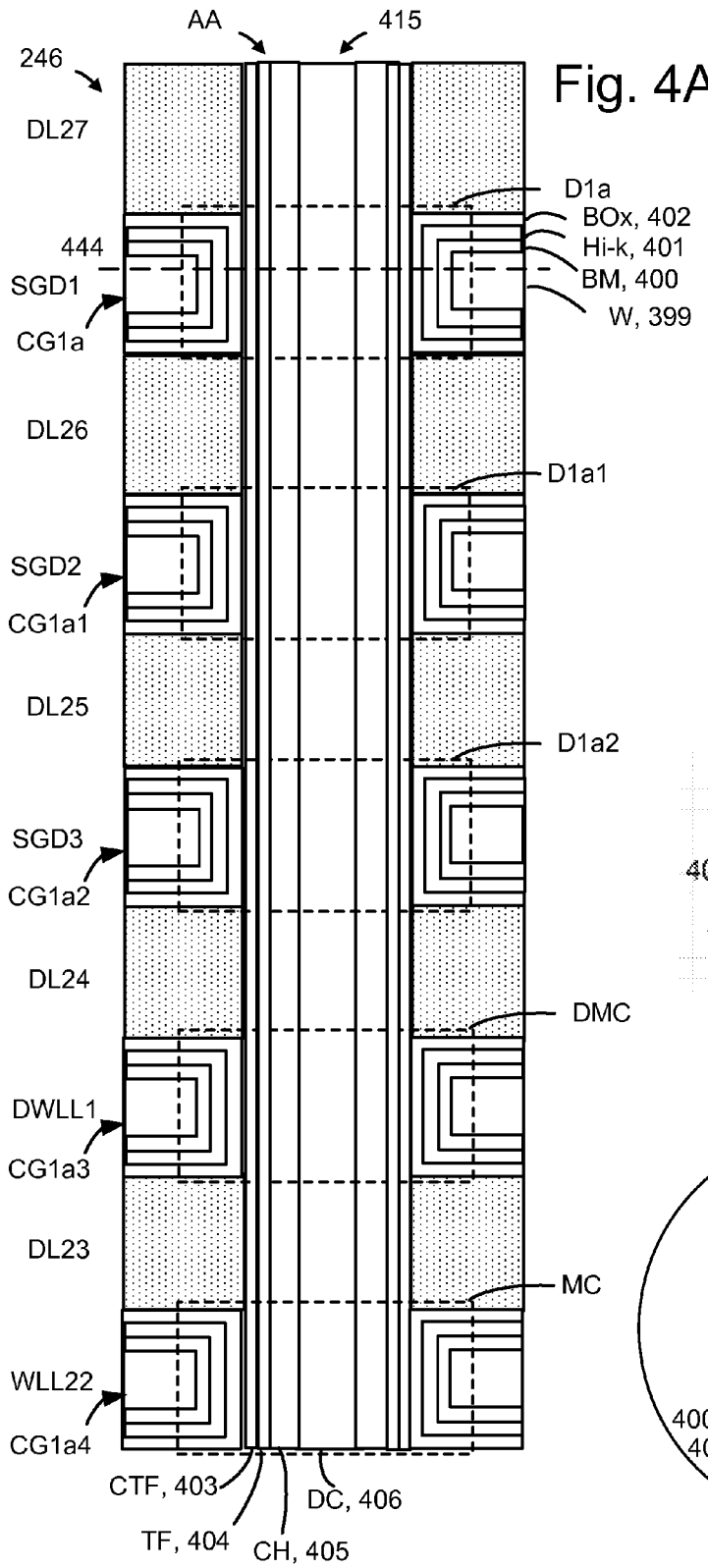
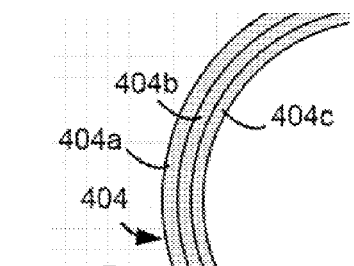
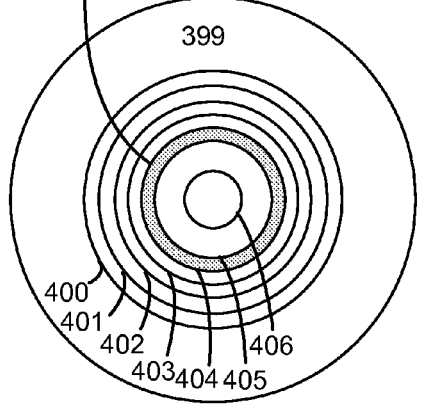

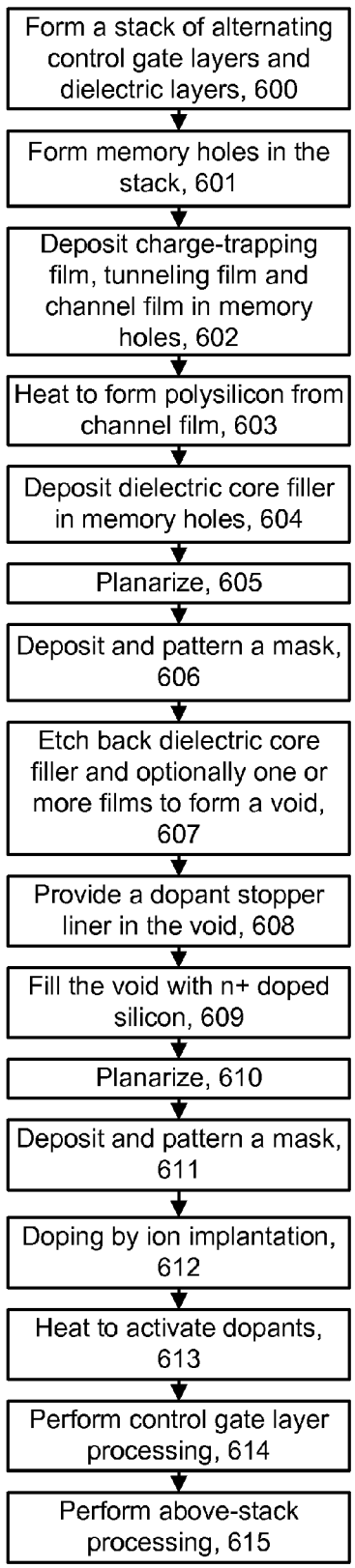
Fig. 6A
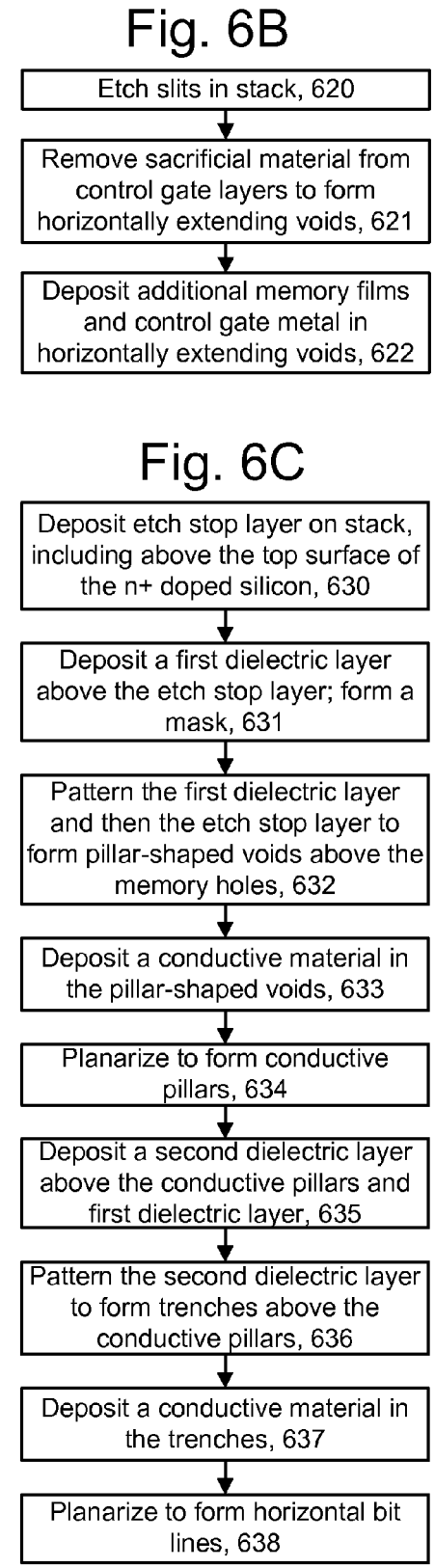
Fig. 6B
Fig. 6C

Fig. 7A
Fig. 7B
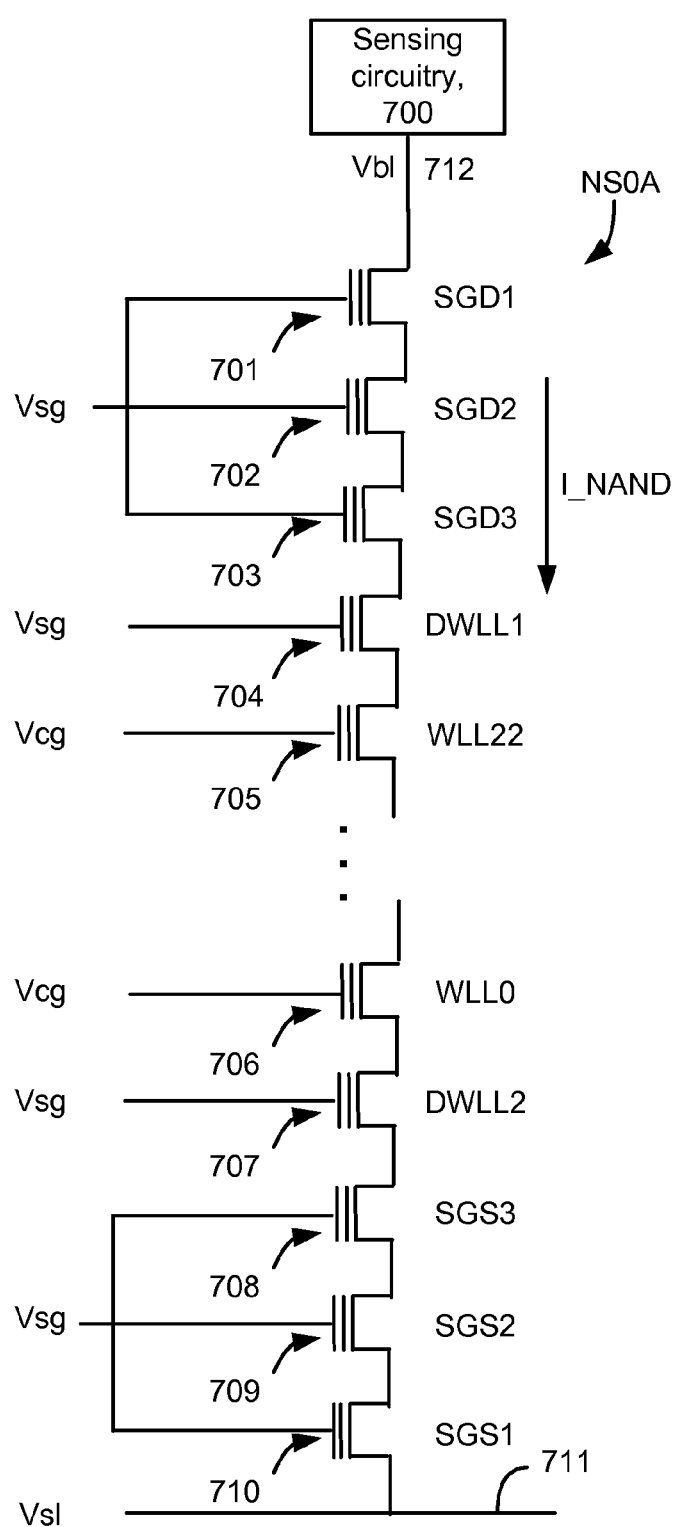
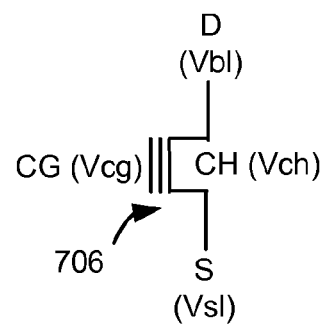

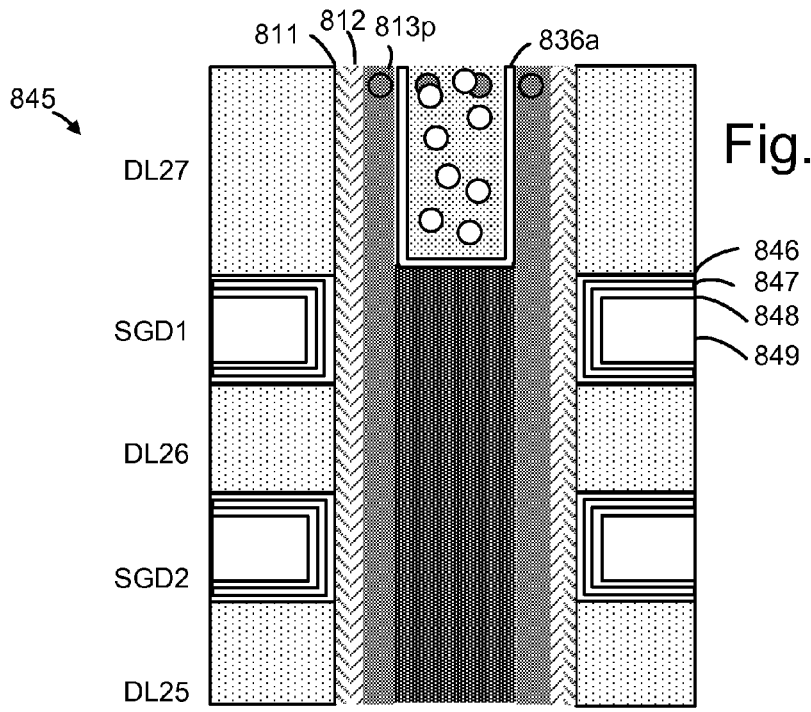
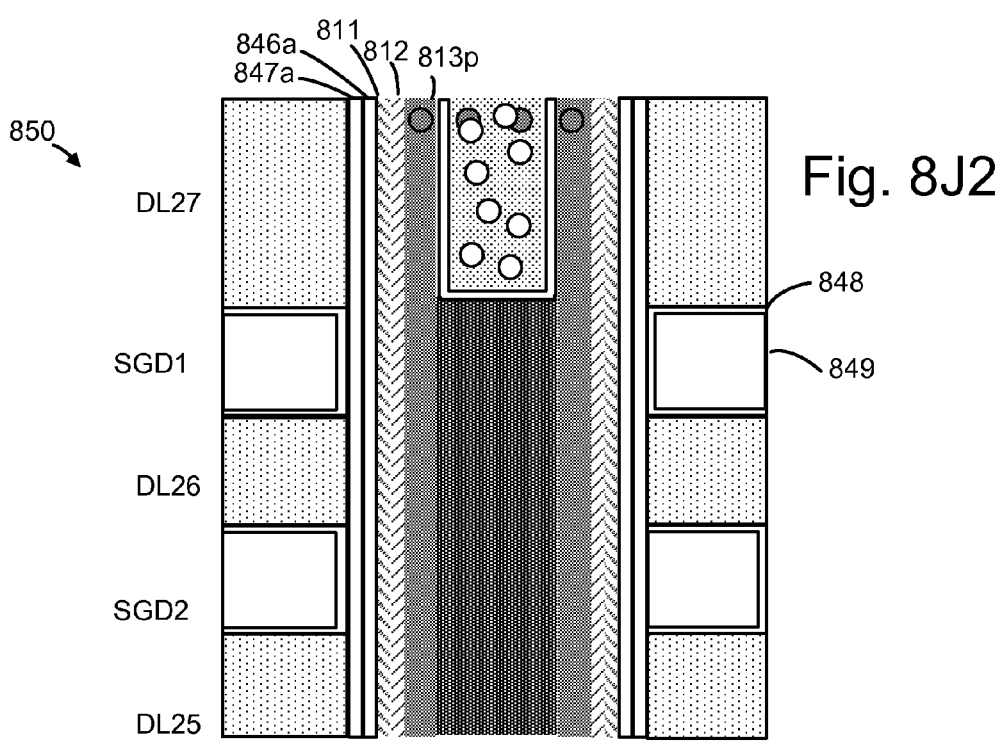

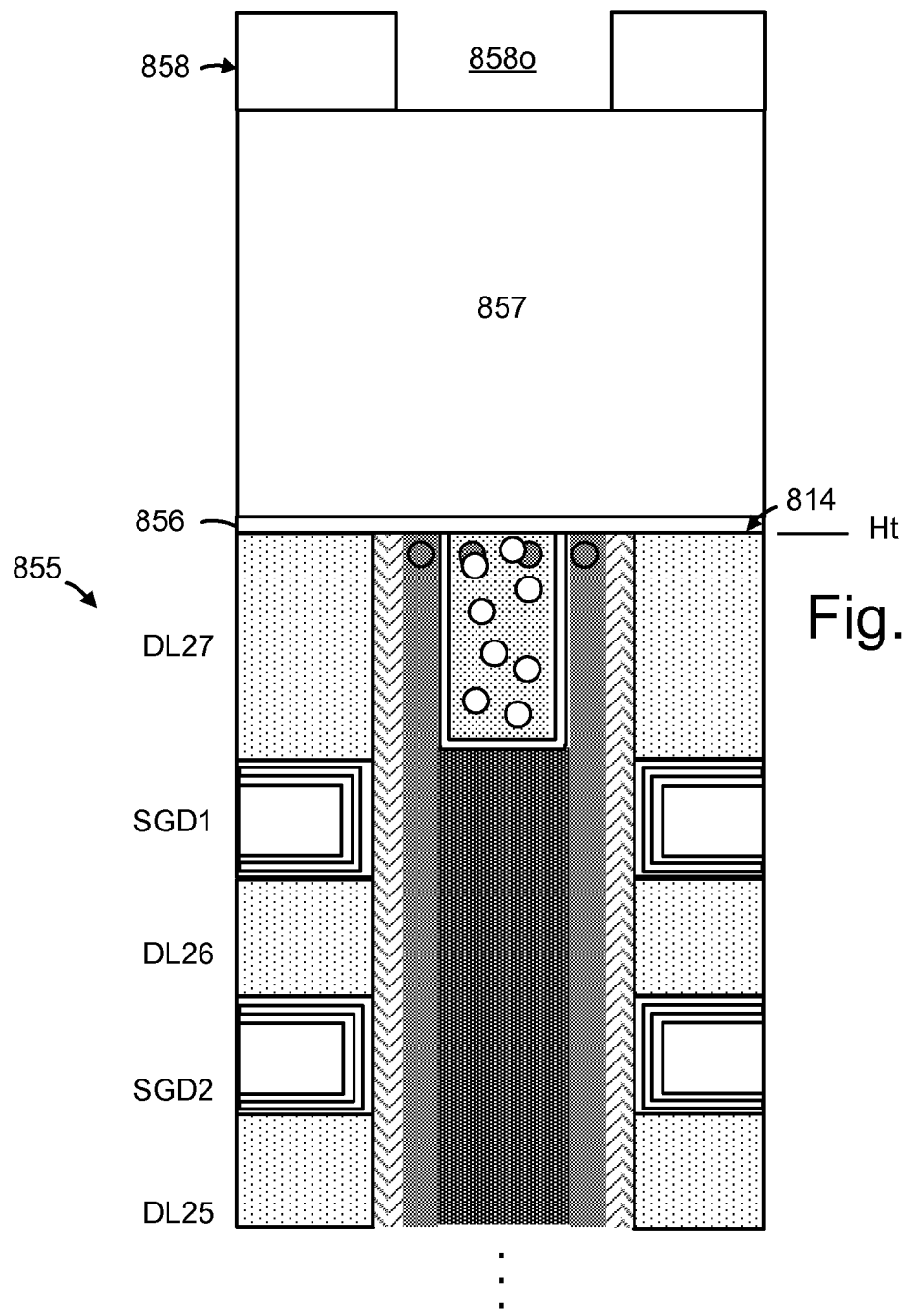

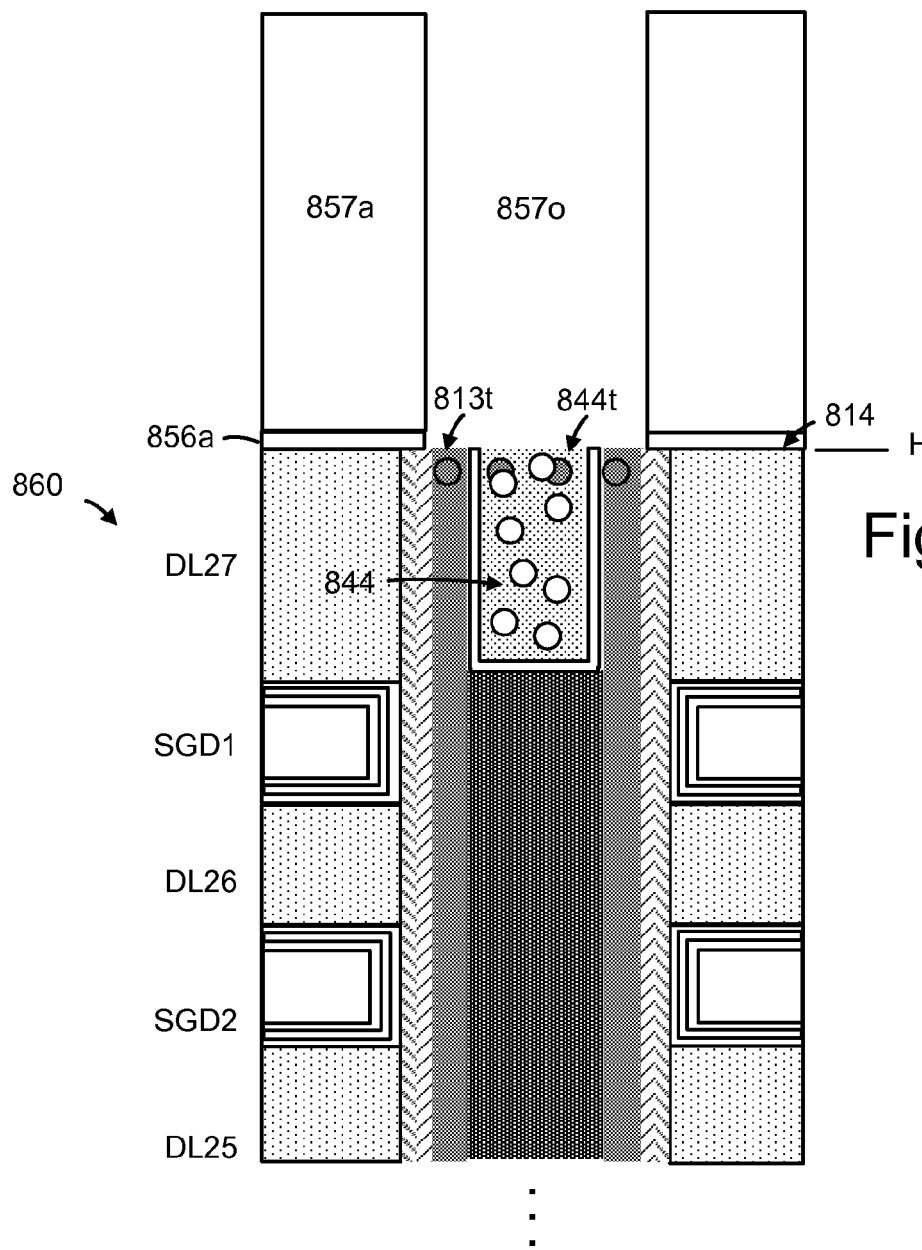

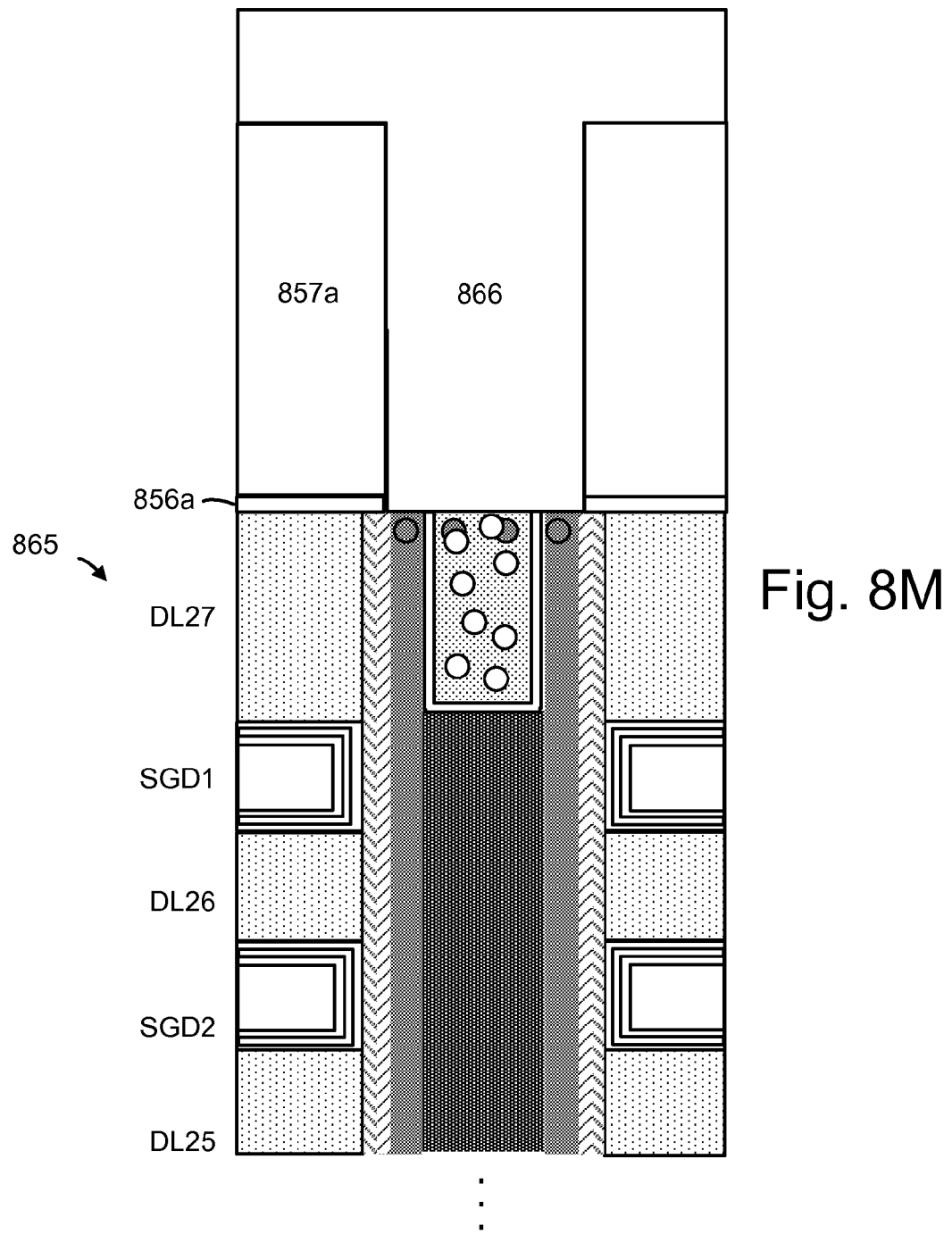

CONTACT FOR VERTICAL MEMORY WITH DOPANT DIFFUSION STOPPER AND ASSOCIATED FABRICATION METHOD

BACKGROUND

The present technology relates to a fabrication method for a memory device and the associated structure of the memory device.

A charge-trapping material can be used in memory devices to store a charge which represents a data state. The charge-trapping material can be arranged vertically in a three-dimensional (3D) stacked memory structure, or horizontally in a two-dimensional (2D) memory structure. One example of a 3D memory structure is the Bit Cost Scalable (BiCS) architecture which comprises a stack of alternating conductive and dielectric layers. A memory hole is formed in the stack and a NAND string is then formed by filling the memory hole with materials including a charge-trapping film. A straight NAND string extends in one memory hole, while a pipe- or U-shaped NAND string (P-BiCS) includes a pair of vertical columns of memory cells which extend in two memory holes and which are joined by a bottom back gate. Control gates of the memory cells are provided by the conductive layers.

Moreover, each NAND string is connected at the top of the memory hole to an overlying metal layer such as a bit line. However, various challenges are presented in fabricating such memory devices.

BRIEF DESCRIPTION OF THE DRAWINGS

Like-numbered elements refer to common components in the different figures.

FIG. 3A depicts a top view of an example word line layer 304 of the block BLK0 of FIG. 1A, in a straight NAND string embodiment.

FIG. 3B depicts a top view of an example drain-side select gate (SGD) layer 362, consistent with FIG. 3A.

FIG. 3C1 depicts an embodiment of a stack 376 showing a cross-sectional view of the portion 307 of FIG. 3A, along line 305, where three SGD layers, three SGS layers and dummy word line layers DWLL1 and DWLL2 are provided.

FIG. 3C2 depicts a variation in the width of a memory hole along its height.

FIG. 4A depicts a view of the region 246 of FIG. 3C1, showing SGD transistors D1a (consistent with FIG. 3C1), D1a1 and D1a2 above a dummy memory cell (DMC) and a data-storing memory cell (MC).

FIG. 4B1 depicts a cross-section view of the region 246 of FIG. 4A along line 444.

FIG. 4B2 depicts a close-up view of the tunneling film 404 of FIG. 4B1, showing an oxide 404a, nitride 404b, oxide 404c configuration.

FIG. 6A depicts an example process for forming a memory device which avoids inadvertent doping of a channel film.

FIG. 6B depicts example details of step 614 of FIG. 6A for performing control gate layer processing.

FIG. 6C depicts example details of step 615 of FIG. 6A for performing above-stack processing.

FIG. 7A depicts a circuit diagram of a NAND string consistent with the memory devices of FIGS. 2C and 3C1.

FIG. 7B depicts a circuit diagram of the memory cell 706 of FIG. 7A.

FIG. 8J1 depicts a structure which is formed from the structure of FIG. 8I by performing control gate layer processing, consistent with step 614 of the process of FIG. 6A and with FIG. 6B.

FIG. 8J2 depicts an alternative structure which is formed after step 613 of the process of FIG. 6A, where a block oxide film and a high-k film are in the memory hole rather than in the control gate layer.

FIG. 8K depicts a structure which is formed from the structure of FIG. 8J1 using steps 630 and 631 of FIG. 6C.

FIG. 8L depicts a structure which is formed from the structure of FIG. 8K using step 632 of FIG. 6C.

FIG. 8M depicts a structure which is formed from the structure of FIG. 8L using step 633 of FIG. 6C.

DETAILED DESCRIPTION

Figure 1A:
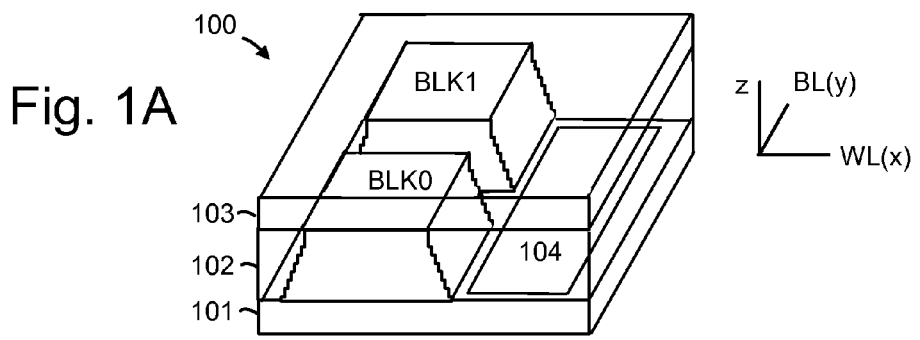
FIG. 1A is a perspective view of a 3D stacked non-volatile memory device.

A vertical memory device is provided which includes a silicon contact at the top of a NAND string within a dopant diffusion stopper material to prevent dopants from entering a channel film of the NAND string from the silicon contact. An associated fabrication process is also provided.

A charge-trapping memory device may use a charge-trapping material such as silicon nitride layer which is separated from a channel film by a tunneling film. One example of a charge-trapping memory device is a 3D memory device in which a stack of alternating conductive and dielectric layers are formed. Memory holes are etched in the stack and films are deposited in the holes such that memory cells or select gate transistors are formed where the conductive layers intersect with the memory holes. The films include a charge-trapping film which extends vertically along an individual cell or an entire NAND string, a tunneling film and a channel film. Some of the conductive layers are used as control gates for memory cells and other conductive layers are used as control gates for select gate transistors, such as drain or source side transistors in NAND strings. Another example of a charge-trapping memory device is a 2D memory device in which the charge-trapping film extends horizontally along a NAND string.

Each NAND string may include one or more select gate transistors at the drain and source ends of the string. Moreover, each NAND string may include an Ohmic contact material at the top of the memory hole which is a conductive interface between the channel film of the NAND string below the contact and a via to a bit line above the contact. In one approach, heavily n+ doped silicon, e.g., in amorphous form, is used to connect a polysilicon channel film of the NAND string to an overlying doped silicon or metal via. The contact can be formed by etching back a dielectric core filler in the center of the memory hole from the top of the hole to create a void, then filling the void with silicon. However, due to elevated temperatures used during the fabrication, some of the dopants in the silicon cap can diffuse into the channel film, including a portion of the channel film which is adjacent to one or more select gate transistors of the NAND string. Potentially, the top one or two select gate transistors can lose their functionality if their channels are short circuited due to the presence of dopants in the channel film. This leads to severe leakage during boosting of unselected NAND strings during programming. Moreover, in cases where the diffusion is less severe, the different select gate transistors at the end of the NAND string can have different doping concentrations, resulting in a widened Vth distribution and a corresponding reduced margin.

A memory device provided herein prevents undesired diffusion of dopants from a silicon cap of a vertical NAND string to a channel film of the NAND string. In one approach, a dopant stopper liner is deposited in the void before depositing the n+ doped silicon. The dopant stopper liner can comprise a conductive material with a low resistivity so that movement of electrons is not blocked. In one approach, the channel film is not etched so that a topmost portion of the channel film extends above the dielectric core filler. In another approach, the channel film is etched back to a common height as the dielectric core filler so that the dopant stopper liner covers the channel film as well as the dielectric core filler. The top of the silicon cap and the channel film, if it is not etched back from the top of the stack, can further be doped by channel implantation for better Ohmic contact with the via.

An associated fabrication process is also provided. The process include forming a memory hole in a stack of alternating control gate layers and dielectric layers, providing a channel film and a dielectric core filler in the memory hole, etching back the dielectric core filler to a height of a top control gate layer to create a void, followed by depositing a dopant stopper liner and then doped silicon in the void. A via is then fabricated above the stack and the memory hole to connect the top of the memory hole to an overlying metal bit line, for instance, or other control line. In one option, the channel film is not etched back from the top of the stack. In another option, one or more films within the memory hole are also etched back from the top of the stack. These can include a channel film, a tunneling film and a charge-trapping film, for instance. A block oxide film and a hi-k film could also be etched back if they are provided in the memory hole. Subsequently, the dopant stopper liner and the silicon are deposited in the void created by the etch back of the dielectric core filler and the optional one or more films. Ion implantation is optionally performed at a top of the memory hole. Annealing, e.g., heating, can also be performed to activate the implanted dopants. Other variations are possible as well.

The following discussion provides details of the construction of example memory devices and of related techniques which address the above and other issues.

FIG. 1A is a perspective view of a 3D stacked non-volatile memory device. The memory device 100 includes a substrate 101. On the substrate are example blocks BLK0 and BLK1 of memory cells and a peripheral area 104 with circuitry for use by the blocks. The substrate 101 can also carry circuitry under the blocks, along with one or more lower metal layers which are patterned in conductive paths to carry signals of the circuitry. The blocks are formed in an intermediate region 102 of the memory device. In an upper region 103 of the memory device, one or more upper metal layers are patterned in conductive paths to carry signals of the circuitry. Each block comprises a stacked area of memory cells, where alternating levels of the stack represent word lines. In one possible approach, each block has opposing tiered sides from which vertical contacts extend upward to an upper metal layer to form connections to conductive paths. While two blocks are depicted as an example, additional blocks can be used, extending in the x- and/or y-directions.

In one possible approach, the length of the plane, in the x-direction, represents a direction in which signal paths to word lines extend in the one or more upper metal layers (a word line or SGD line direction), and the width of the plane, in the y-direction, represents a direction in which signal paths to bit lines extend in the one or more upper metal layers (a bit line direction). The z-direction represents a height of the memory device.

Figure 1B:
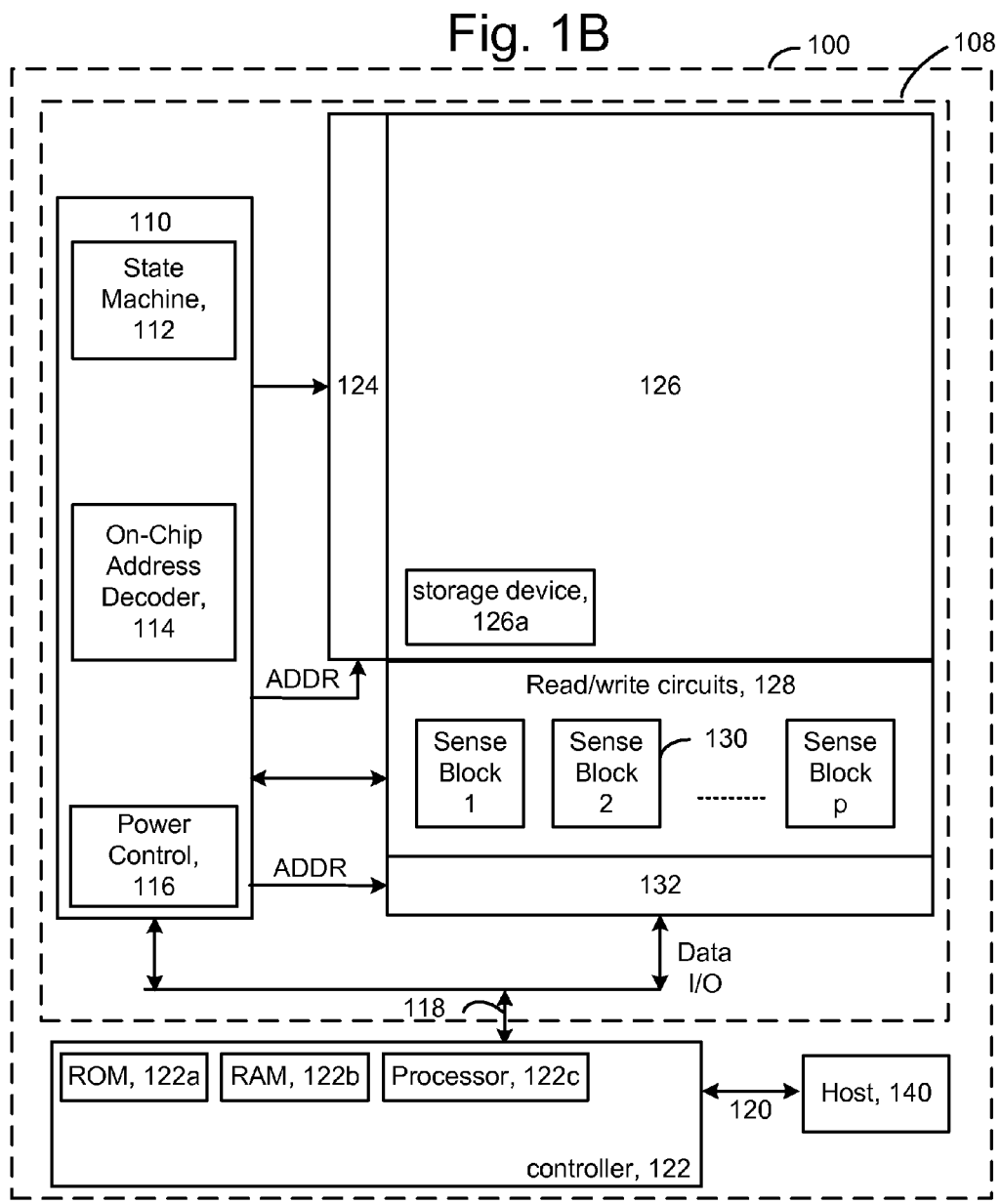
FIG. 1B is a functional block diagram of a memory device such as the 3D stacked non-volatile memory device 100 of FIG. 1A.

FIG. 1B is a functional block diagram of a memory device such as the 3D stacked non-volatile memory device 100 of FIG. 1A. The memory device 100 may include one or more memory die 108. The memory die 108 includes a memory structure 126 of memory cells, such as an array of memory cells, control circuitry 110, and read/write circuits 128. In a 3D configuration, the memory structure can include the blocks BLK0 and BLK1 of FIG. 1A. The memory structure 126 is addressable by word lines via a row decoder 124 and by bit lines via a column decoder 132. The read/write circuits 128 include multiple sense blocks 130 (sensing circuitry) and allow a page of memory cells to be read or programmed in parallel. Typically a controller 122 is included in the same memory device 100 (e.g., a removable storage card) as the one or more memory die 108. Commands and data are transferred between the host 140 and controller 122 via lines 120 and between the controller and the one or more memory die 108 via lines 118.

The memory structure can be 2D or 3D. The memory structure may comprise one or more array of memory cells including a 3D array. The memory structure may comprise a monolithic three dimensional memory structure in which multiple memory levels are formed above (and not in) a single substrate, such as a wafer, with no intervening substrates. The memory structure may comprise any type of non-volatile memory that is monolithically formed in one or more physical levels of arrays of memory cells having an active area disposed above a silicon substrate. The memory structure may be in a non-volatile memory device having circuitry associated with the operation of the memory cells, whether the associated circuitry is above or within the substrate.

The control circuitry 110 cooperates with the read/write circuits 128 to perform memory operations on the memory structure 126, and includes a state machine 112, an on-chip address decoder 114, and a power control module 116. The state machine 112 provides chip-level control of memory operations.

Referring again to FIG. 1B, the on-chip address decoder 114 provides an address interface between that used by the host or a memory controller to the hardware address used by the decoders 124 and 132. The power control module 116 controls the power and voltages supplied to the word lines and bit lines during memory operations. It can includes drivers for word line layers (WLLs) in a 3D configuration, SGS and SGD transistors and source lines. The sense blocks 130 can include bit line drivers, in one approach. An SGS transistor is a select gate transistor at a source end of a NAND string, and an SGD transistor is a select gate transistor at a drain end of a NAND string.

In some implementations, some of the components can be combined. In various designs, one or more of the components (alone or in combination), other than memory structure 126, can be thought of as at least one control circuit which is configured to perform the actions described herein. For example, a control circuit may include any one of, or a combination of, control circuitry 110, state machine 112, decoders 114/132, power control module 116, sense blocks 130, read/write circuits 128, and controller 122, and so forth.

The off-chip controller 122 may comprise a processor 122c and storage devices (memory) such as ROM 122a and RAM 122b. The storage devices comprises code such as a set of instructions, and the processor is operable to execute the set of instructions to provide the functionality described herein. Alternatively or additionally, the processor can access code from a storage device 126a of the memory structure, such as a reserved area of memory cells in one or more word lines.

Other types of non-volatile memory in addition to NAND flash memory can also be used.

Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse or phase change material, and optionally a steering element, such as a diode or transistor. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND string is an example of a set of series-connected transistors comprising memory cells and select gate transistors.

A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are exemplary, and memory elements may be otherwise configured.

The semiconductor memory elements located within and/or over a substrate may be arranged in two or three dimensions, such as a two dimensional memory structure or a three dimensional memory structure.

In a two dimensional memory structure, the semiconductor memory elements are arranged in a single plane or a single memory device level. Typically, in a two dimensional memory structure, memory elements are arranged in a plane (e.g., in an x-y direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three dimensional memory array is arranged so that memory elements occupy multiple planes or multiple memory device levels, thereby forming a structure in three dimensions (i.e., in the x, y and z directions, where the z direction is substantially perpendicular and the x and y directions are substantially parallel to the major surface of the substrate).

As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory elements. The columns may be arranged in a two dimensional configuration, e.g., in an x-y plane, resulting in a three dimensional arrangement of memory elements with elements on multiple vertically stacked memory planes. Other configurations of memory elements in three dimensions can also constitute a three dimensional memory array.

By way of non-limiting example, in a three dimensional NAND memory array, the memory elements may be coupled together to form a NAND string within a single horizontal (e.g., x-y) memory device level. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Then again, two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this technology is not limited to the two dimensional and three dimensional exemplary structures described but covers all relevant memory structures within the spirit and scope of the technology as described herein and as understood by one of skill in the art.

Figure 2A:
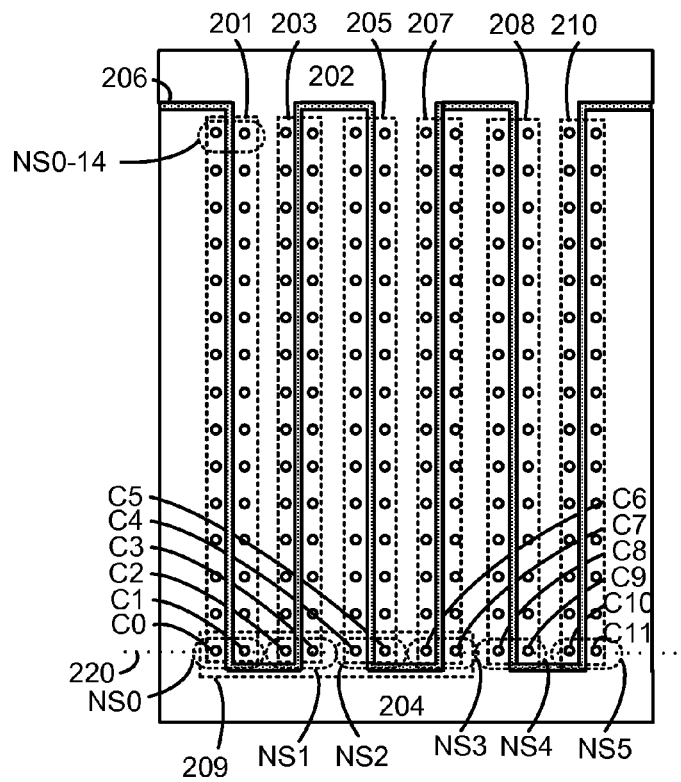
FIG. 2A depicts a top view of example word line layers 202 and 204 in a U-shaped NAND embodiment, as an example implementation of BLK0 in FIG. 1A.
Figure 2A:
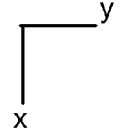

FIG. 2A depicts a top view of example word line layers 202 and 204 in a U-shaped NAND embodiment, as an example implementation of BLK0 in FIG. 1A. In a 3D stacked memory device, memory cells are formed along memory holes which extend through alternating conductive and dielectric layers in a stack. The memory cells are typically arranged in NAND strings. Each conductive layer can include one or more word line layers. A word line layer is an example of a word line.

The view is of a representative layer among the multiple WLLs in a stack. Referring also to FIG. 2C, the stack includes alternating dielectric and conductive layers. The dielectric layers include DL0 to DL25 and may be made of SiO2, for instance. The conductive layers include a back gate layer (BGL), data-storing word line layers WLL0 to WLL19, dummy (non-data-storing) word line layers DWLLa and DWLLb, and select gate layers SGL1, SGL2 and SGL3. The word line layers are conductive paths to control gates of the memory cells at the layer. Moreover, each select gate layer may comprises conductive lines to select gate transistors (e.g., SGD and/or SGS transistors).

The word line layers of FIG. 2A may represent any one of the word line layers in FIG. 2C. These conductive layers may include doped polysilicon, metal such as tungsten or metal silicide, for instance. An example voltage of 5-10 V may be applied to the back gate to maintain a conductive state which connects the drain- and source-side columns.

For each block, each conductive layer may be divided into two word line layers 202 and 204 which are insulated from one another by a slit 206. The slit is formed by etching a void which extends vertically in the stack, typically from an etch stop layer at the bottom to at least a top layer of the stack, then filling the slit with insulation. This is an example of the type of etching which can result in the accumulation of charges in the top conductive layer of the stack. The slit 206 is a single continuous slit which extends in a zig-zag pattern in the block. This approach can provide greater flexibility in controlling the memory cells since the WLLs can be driven independently.

Each block includes vertically-extending memory holes or pillars which extend vertically in the stack, and comprise a column of memory cells such as in a NAND string. Each circle represents a memory hole or a memory cell associated with the word line layer. Example columns of memory cells along a line 220 include C0 to C11. Columns C0, C3, C4, C7, C8 and C11 represent the drain side columns of respective NAND strings. Columns C1, C2, C5, C6, C9 and C10 represent the source side columns of respective NAND strings. The figure represents a simplification, as many more rows of memory holes will typically be used, extending to the right and left in the figure. Also, the figures are not necessarily to scale. The columns of memory cells can be arranged in subsets such as sub-blocks.

Further, the NAND strings are arranged in sets, where each NAND string in a set has an SGD transistor with a common control gate voltage. See also FIG. 2B. Regions 201, 203, 205, 207, 208 and 210 each represent a set of NAND strings, or a set of memory cells in a word line layer. For example, region 210 includes NAND strings NS0, . . . , NS0-14. A programming operation can involve one set of NAND strings. Each NAND string in a set can be associated with a respective bit line which is independently controlled to allow or inhibit programming.

The drawings are not to scale and do not show all memory columns. For example, a more realistic block might have twelve memory columns in the y direction as shown, but a very large number such as 32 k memory columns in the x direction, for a total of 384,000 memory columns in a block. With U-shaped NAND strings, 192 k NAND strings are provided in this example. With straight NAND strings, 384,000 NAND strings are provided in this example. Assuming there are twenty-four memory cells per column, there are 384,000× 24=9,216,002 memory cells in the set.

Figure 2B:
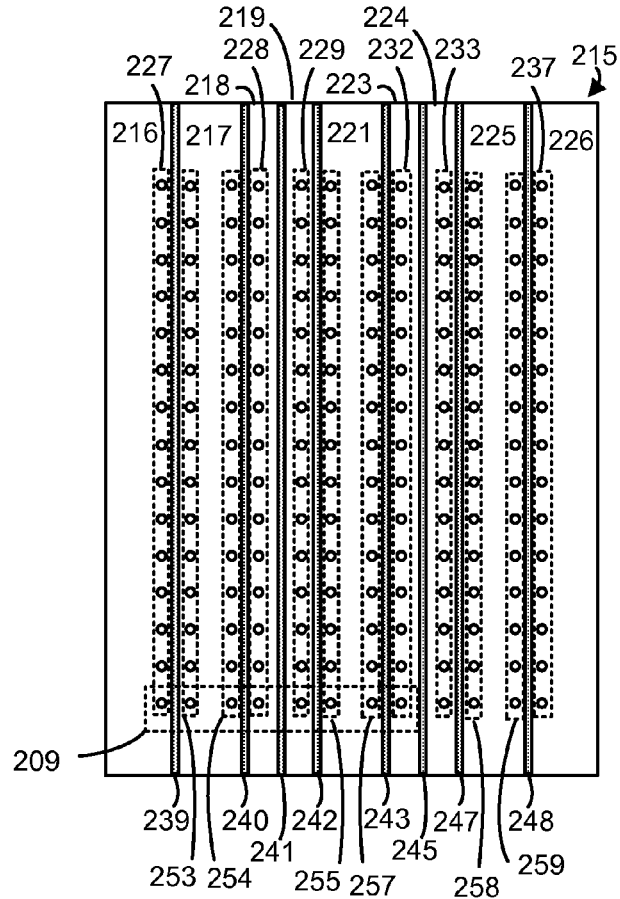
FIG. 2B depicts a top view of example select gate layer portions, consistent with FIG. 2A.
Figure 2B:
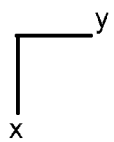
Figure 2C:
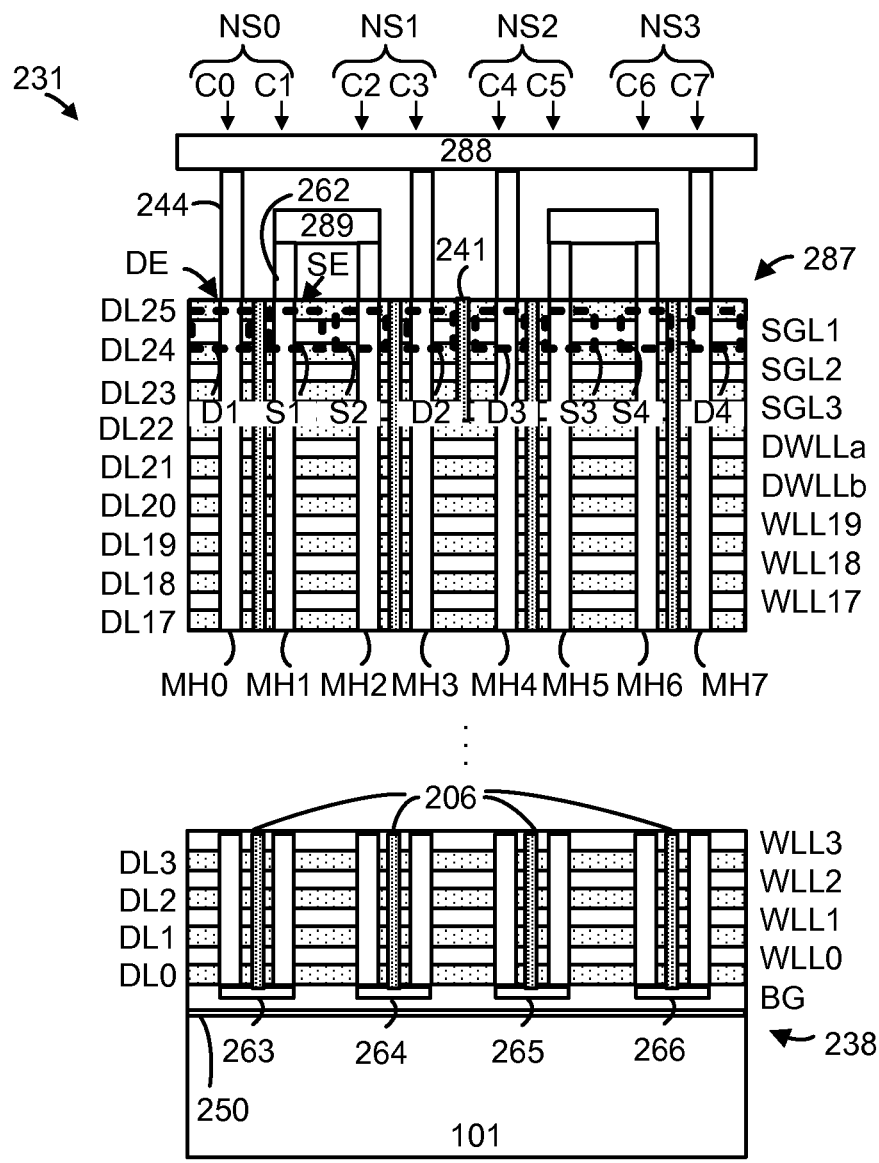
FIG. 2C depicts an embodiment of a stack 231 showing a cross-sectional view of the portion 209 of FIG. 2A, along line 220, where three select gate layers, SGL1, SGL2 and SGL3 are provided.

FIG. 2B depicts a top view of example select gate layer portions, consistent with FIG. 2A. In one approach, the select gate layer 215 is different than a WLL in that a separate SGD layer portion or line, is provided for each set of NAND strings. That is, each single row of SGD transistors extending in the x direction is separately controlled. In other words, the control gates of the SGD transistors in each set of NAND strings are commonly controlled.

Further, an SGS layer portion or line is provided for a pair of rows of SGS transistors extending in the x direction, in one approach, for adjacent sets of NAND strings. Optionally, additional slits are used so that a separate SGS layer portion is provided for a single row of SGS transistors extending in the x direction. Thus, the control gates of the SGS transistors in a pair of rows of SGS transistors, or in a single row of SGS transistors, are also commonly controlled.

The SGS and SGD layer portions are created due to slits 239, 240, 241, 242, 243, 245, 247 and 248. The slits extend partway down in the stack as depicted by example slit 241 in FIG. 2C. Regions 227, 228, 229, 232, 233 and 237 represent SGD transistors in SGD lines 216, 218, 219, 223, 224 and 226, respectively. Regions 253 and 254, 255 and 257, and 258 and 259 represent SGS transistors in SGS lines 217, 221 and 225, respectively. Regions 255 and 257, 258 and 259, represent SGS transistors in SGS layer portions 221 and 225, respectively. The portion 209 from FIG. 2A is repeated for reference.

The select gate transistors are associated with NAND strings NS0-NS5.

FIG. 2C depicts an embodiment of a stack 231 showing a cross-sectional view of the portion 209 of FIG. 2A, along line 220, where three select gate layers, SGL1, SGL2 and SGL3 are provided. In this case, the slit extends down to DL22, so that three separate layers of select gate transistors are formed in each column of each NAND string. The stack has a top 287 and a bottom 238. The word line layers and select gate layers are examples of control gate layers. The word line layers are connected to memory cells and the select gate layers are connected to select gate transistors. A control gate layer may refer generally to a horizontally-extending region of a stack with a defined vertical thickness. Moreover, a configuration of the control gate layer can change during the fabrication process. For example, control gate layers may initially comprise a sacrificial material such as SiN. The sacrificial material may be removed by wet etching from a slit in the stack to provide the control gate layers as horizontally-extending voids. These voids can then be filled with films and metal which form the final configuration, such as discussed in connection with FIG. 4A.

The conductive layers of the select gates can have a same height (channel length) as the conductive layers of the memory cells, in one approach. This facilitates the fabrication of the memory device. In a column, the individual select gate transistors together are equivalent to one select gate transistor having a channel length which is the sum of the channel lengths of the individual select gate transistors. Further, in one approach, select gate transistors in a column (e.g., in layers SGL1, SGL2 and SGL3) are connected and received a common voltage during operations. The SGS transistors can have a similar construction as the SGD transistors. Further, the SGS and SGD transistors can have a similar construction as the memory cell transistors.

The substrate may be p-type and can provide a ground which is connected to the top select gate layer, in one approach. A via 244 connects a drain side of C0 and NS0 to a bit line 288. A via 262 connects a source side of C1 and NS0 to a source line 289. Back gates 263, 264, 265 and 266 are provided in NS0, NS1, NS2 and NS3, respectively.

Regions D1, D2, D3 and D4 represent SGD transistors and regions S1, S2, S3 and S4 represent SGS transistors in SGL1.

Figure 2D:
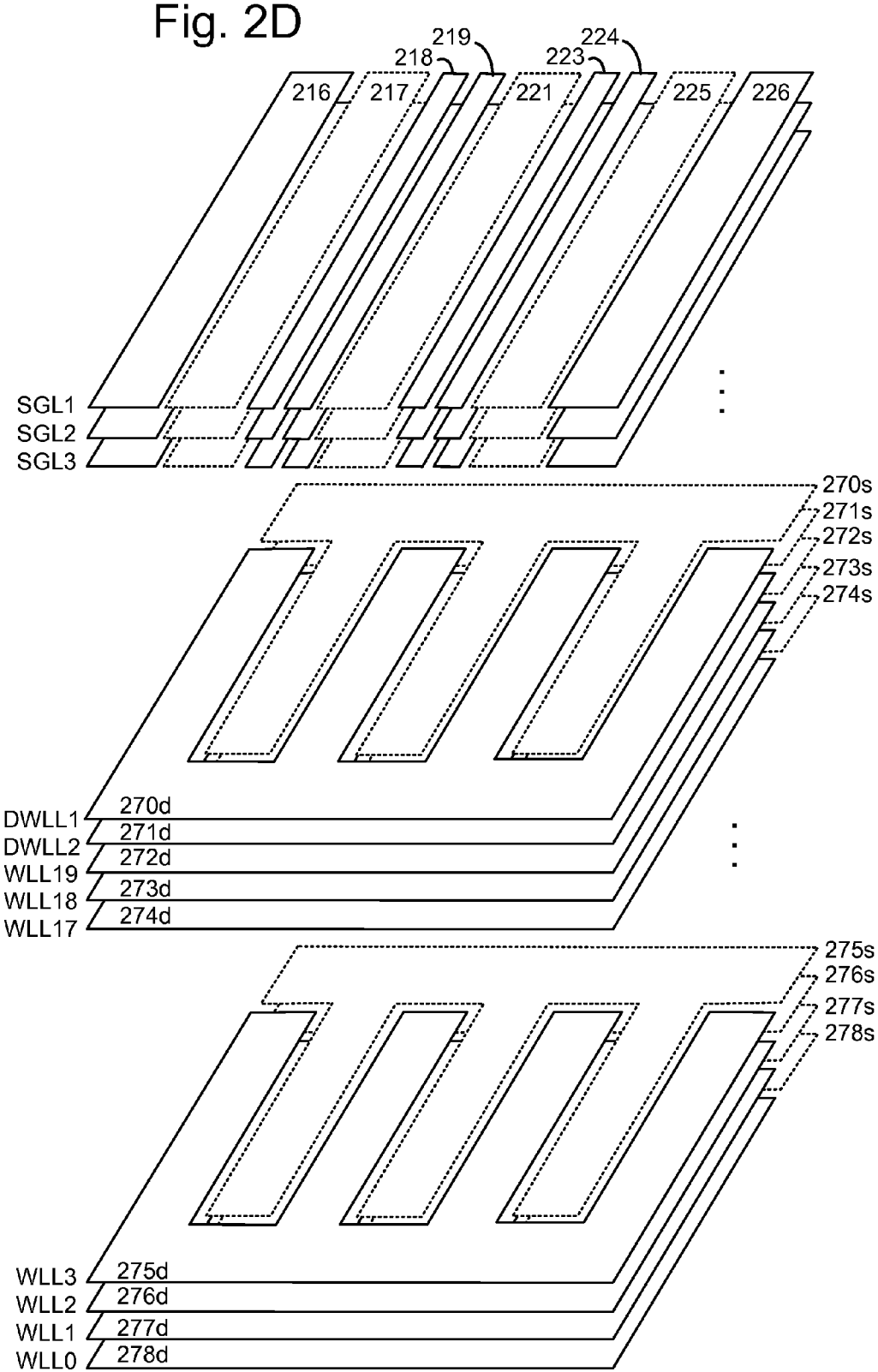
FIG. 2D depicts an alternative view of the select gate layers and word line layers of the stack 231 of FIG. 2C.

FIG. 2D depicts an alternative view of the select gate layers and word line layers of the stack 231 of FIG. 2C. The SGL layers SGL1, SGL2 and SGL3 each includes parallel rows of select gate lines associated with the drain-side (shown by solid lines) or source-side (shown by dotted lines) of a set of NAND strings. For example, SGL1 includes drain-side select gate lines 216, 218, 219, 223, 224 and 226 and source-side select gate lines 217, 221 and 225, consistent with FIG. 2B. Each select gate line can be independently controlled, in one approach.

Below, the SGL layers are the word line layers. Each word line layer includes a drain-side word line connected to memory cells on a drain-side of a NAND string (the half of a NAND string between the back gate and the drain end) and a source-side word line connected to memory cells on a source-side of a NAND string (the half of a NAND string between the back gate and the source end). For example, DWLL1, DWLL2, WLL19, WLL18 and WLL17 include drain-side word lines $270d$, $271d$, $272d$, $273d$ and $274d$, respectively, and source-side word lines $270s$, $271s$, $272s$, $273s$ and $274s$, respectively. WLL3, WLL2, WLL1 and WLL0 include drain-side word lines $275d$, $276d$, $277d$ and $278d$, respectively, and source-side word lines $275s$, $276s$, $277s$ and $278s$, respectively. Each word line can be controlled independently, in one approach.

In an example programming operation, the source-side word line $272s$ is a first programmed word line and a drain-side word line $272d$ is a final programmed word line in a block.

FIG. 3A depicts a top view of an example word line layer 304 of the block BLK0 of FIG. 1A, in a straight NAND string embodiment. In this configuration, a NAND string has only one column, and the source-side select gate is on the bottom of the column instead of on the top, as in a U-shaped NAND string. Moreover, a given level of a block has one WLL which is connected to each of the memory cells of the layer. Insulation-filled slits 346, 347, 348, 349 and 350 can also be used in the fabrication process to provide structural support for the stack when undoped polysilicon layers are removed by a wet etch and a dielectric is deposited to form the alternating dielectric layers. A dashed line 305 extends through columns C12-C17. A cross-sectional view along line 305 of portion 307 is shown in FIG. 3C1.

Regions 340, 341, 342, 343, 344 and 345 represent the memory cells (as circles) of respective sets of NAND strings. For example, region 340 represents memory cells in NAND strings NS0A, . . . , NS0A-14. Additional NAND strings include NS1A, NS2A, NS3A, NS4A and NS5A.

Alternatively, the layer 304 represents an SGS layer, in which case each circle represents an SGS transistor.

FIG. 3B depicts a top view of an example SGD layer 362, consistent with FIG. 3A. Slits 357, 358, 359, 360 and 361 divide the SGD layer into portions 363, 364, 365, 366, 367 and 368. Each portion connects the SGD transistors in a set of NAND strings. For example, SGD layer portion 363 or line connects the SGD transistors in the set of NAND strings NS0A to NS0A-14. Regions 351, 352, 353, 354, 355 and 356 represent the SGD transistors (as circles) of respective sets of NAND strings in the SGD layer portions 363, 364, 365, 366, 367 and 368, respectively. The portion 307 from FIG. 3A is also repeated. The select gate transistors are associated with NAND strings NS0A-NS5A.

FIG. 3C1 depicts an embodiment of a stack 376 showing a cross-sectional view of the portion 307 of FIG. 3A, along line 305, where three SGD layers, three SGS layers and dummy word line layers DWLL1 and DWLL2 are provided. Columns of memory cells corresponding to NAND strings NS0A-NS3A are depicted in the multi-layer stack. The stack includes a substrate 101, an insulating film 250 on the substrate, and a portion of a source line SL0A. Additional straight NAND strings in a SGD line subset extend behind the NAND strings depicted in the cross-section, e.g., along the x-axis. NS0A has a source end SEa and a drain end DEa. The slits 346, 347 and 348 from FIG. 3A are also depicted. A portion of the bit line BL0A is also depicted. A conductive via 373 connects DEa to BL0A. The columns are formed in memory holes MH0-MH4. The memory holes are columnar and extend at least from a top 370 to a bottom 371 of the stack.

The source line SL0A is connected to the source ends of each NAND string. SL0A is also connected to other sets of memory strings which are behind these NAND strings in the x direction.

Word line layers, e.g., WLL0-WLL23, and dielectric layers, e.g., DL0-DL24, are arranged alternatingly in the stack. SGS transistors 369, 372, 374 and 375 are formed in the SGS1 layer.

Figure 4C:
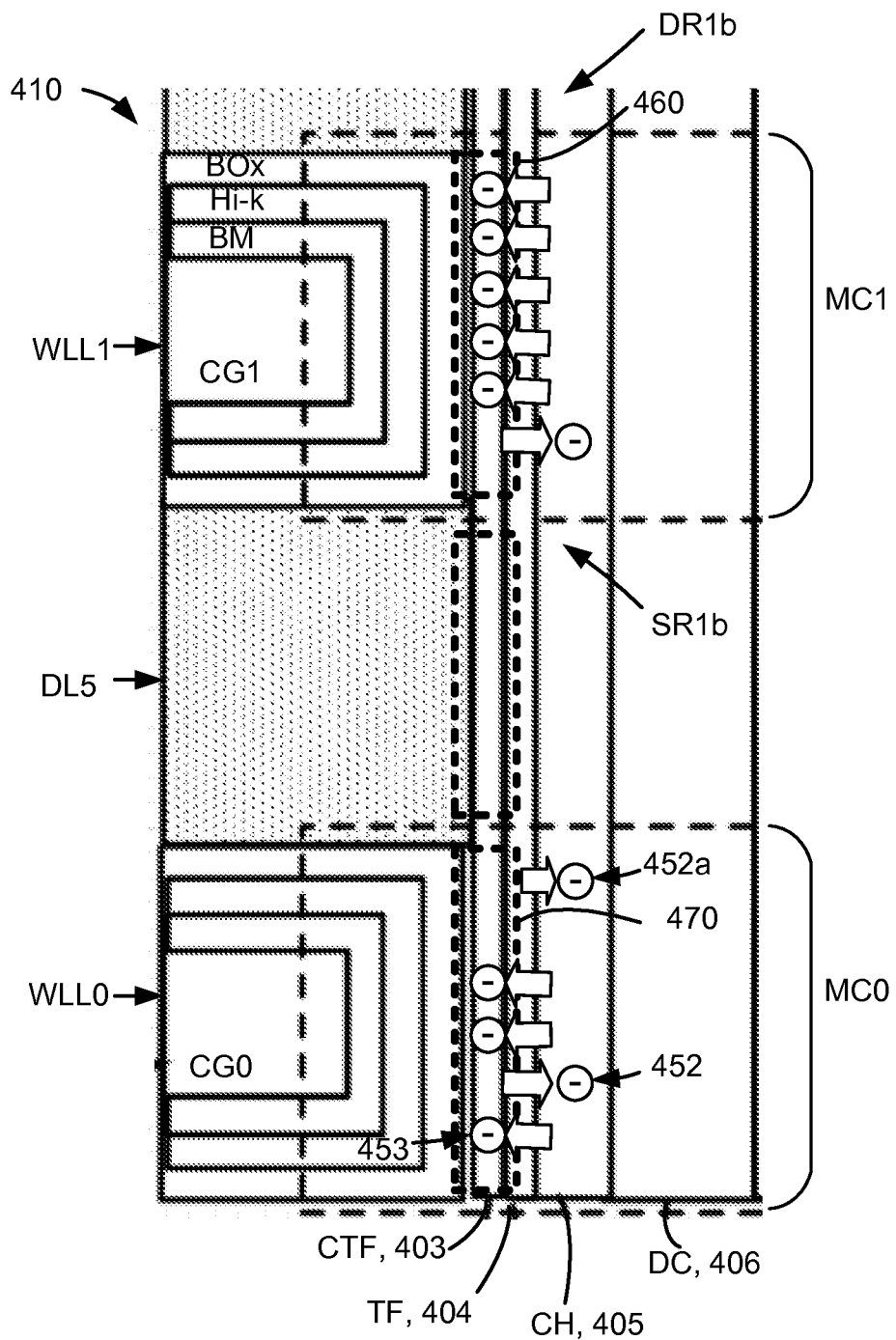
FIG. 4C depicts an expanded view of a region 410 of the NAND string of FIG. 3C2.

A region 246 of the stack is shown in greater detail in FIG. 4A. A region 410 of the stack is shown in greater detail in FIG. 4C. Regions D1a, D2a, D3a and D4a represent SGD transistors.

FIG. 3C2 depicts a variation in the width of a memory hole along its height. Due to the etching process used to create the memory holes, the cross-sectional width, e.g., diameter, of the memory hole can vary along its height. This is due to the very high aspect ratio. For example, a depth-to-diameter ratio of about 25-30 is common. Typically, the diameter becomes progressively smaller from the top to the bottom of the memory hole. In some case, a slight narrowing occurs at the top of the hole, as depicted, so that the diameter becomes slight wider before becoming progressively smaller from the top to the bottom of the memory hole.

Due to the non-uniformity in the width of the memory hole, and the width of the vertical pillar which is formed in the memory hole, the programming and erase speed of the memory cells can vary based on their position along the memory hole. With a smaller diameter memory hole, the electric field across the tunneling film is stronger, so that the programming and erase speed is higher.

In this case, the memory cells are arranged along vertically-extending memory holes (MH0-MH7) in the memory device, and a width of the vertically-extending memory holes varies along a height of the memory device.

Figure 3D:
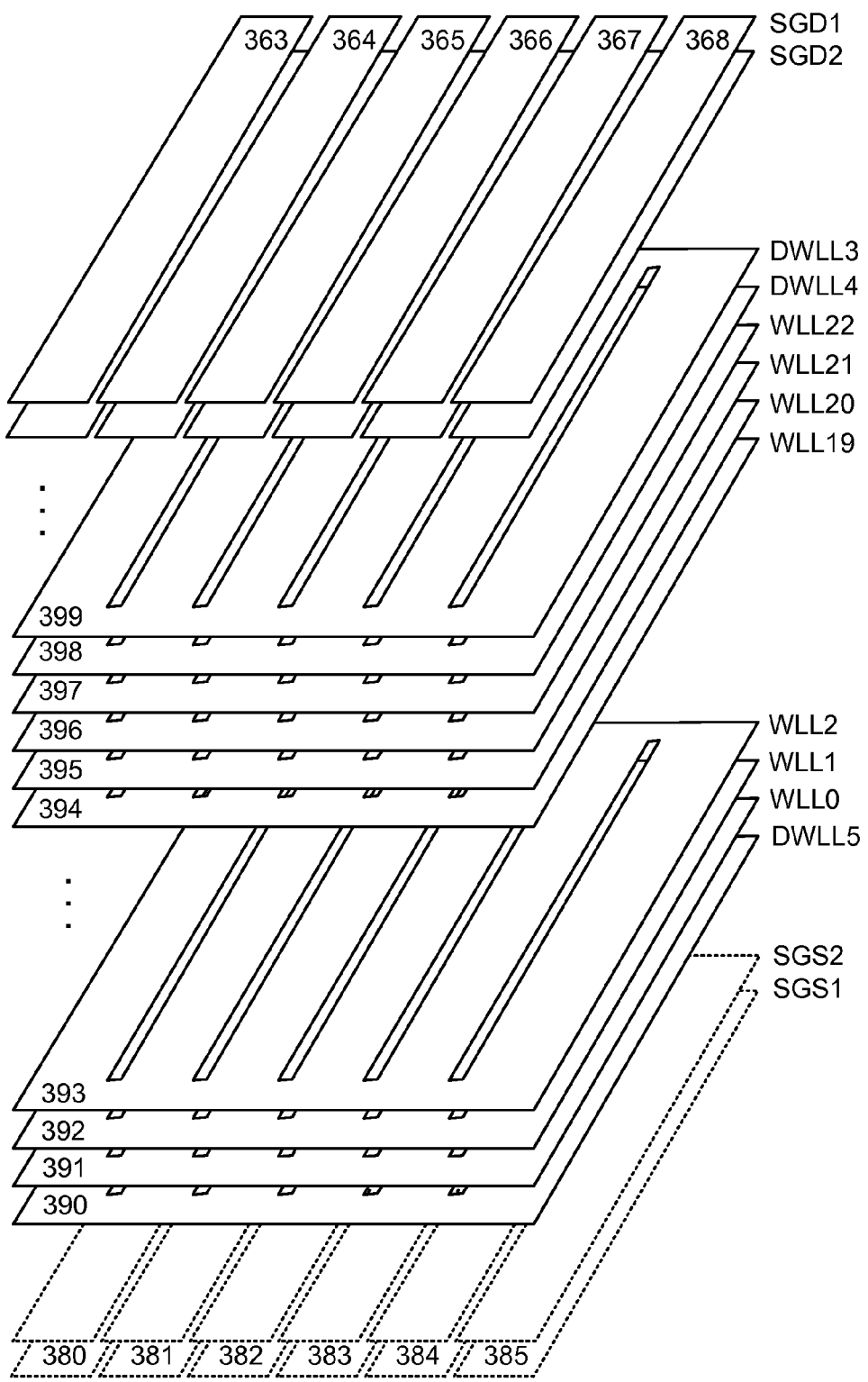
FIG. 3D depicts an alternative view of the select gate layers and word line layers of the stack 376 of FIG. 3C.

FIG. 3D depicts an alternative view of the select gate layers and word line layers of the stack 376 of FIG. 3C. The SGD layers SGD1 and SGD2 each includes parallel rows of select gate lines associated with the drain-side of a set of NAND strings. For example, SGD1 includes drain-side select gate lines 363, 364, 365, 366, 367 and 368, consistent with FIG. 3B. Each select gate line can be independently controlled, in one approach.

Below the SGD layers are the word line layers. Each word line layer represents a word line, in one approach, and is connected to a set of memory cells at a given height in the stack. For example, DWLL3, DWLL4, WLL22, WLL21, WLL20 and WLL19 represent word lines 399, 398, 397, 396, 395 and 394, respectively. WLL2, WLL1, WLL0 and DWLL5 represent word lines 393, 392, 391 and 390, respectively. Each word line can be controlled independently, in one approach.

Below the word line layers are the SGS layers. The SGS layers SGS1 and SGS2 each includes parallel rows of select gate lines associated with the source-side of a set of NAND strings. For example, SGS1 includes source-side select gate lines 380, 381, 382, 383, 384 and 385. Each select gate line can be independently controlled, in one approach.

In an example programming operation, the source-side word line 391 is a first programmed word line and a drain-side word line 397 is a final programmed word line in a block.

FIG. 4A depicts a view of the region 246 of FIG. 3C1, showing SGD transistors D1a, D1a1 and D1a2 above a dummy memory cell (DMC) and a data-storing memory cell (MC). A number of layers can be deposited along the sidewalls of the column and within each word line layer. These layers can include oxide-nitride-oxide (O—N—O) and polysilicon layers which are deposited, e.g., using atomic layer deposition. For example, the column includes a charge-trapping film (CTF) 403 such as SiN or other nitride, a tunneling film (TL) 404, a polysilicon body or channel (CH) 405, and a dielectric core (DC) 406. A word line layer includes a block oxide (BOx) 402, a block high-k material 401, a barrier metal 400, and a conductive metal such as W 399 as a control gate. For example, control gates CG1a, CG1a1, CG1a2, CG1a3 and CG1a4 are provided for the SGD transistors D1a, D1a1 and D1a2, the dummy memory cell DMC and the memory cell MC, respectively. In another approach, all of these layers except the metal are provided in the column. Additional memory cells are similarly formed throughout the columns. The layers in the memory hole form a columnar active area (AA) of the NAND string.

In particular, a pillar 415 is formed in the in the stack. The pillar comprises an annular channel film 405 and a dielectric core filler 406 within the annular channel film. The annular channel film and the dielectric core filler extend up to a top of the stack in this view.

The use of one or more dummy memory cells between the select gate transistors and the data-storing memory cells is useful since program disturb can be greater for memory cells adjacent to, or close to, the select gate transistors. These edge cells have a lower amount of channel boosting due to constraints on the voltages of the select gate transistors of an inhibited NAND string. In particular, to provide the select gate transistors in a non-conductive state, a relatively low voltage is applied to their control gates, resulting in a relatively lower amount of channel boosting in a region of the channel next to these select gate transistors. A region of the channel next to an edge cell will therefore also have a relatively lower amount of channel boosting. In contrast, the memory cells next to a non-edge cell can receive a relatively high pass voltage since these cells are provided in a conductive state, resulting in a relatively higher amount of channel boosting.

When a memory cell is programmed, electrons are stored in a portion of the CTF which is associated with the memory cell. These electrons are drawn into the CTFL from the channel, and through the tunneling film (TF). The Vth of a memory cell is increased in proportion to the amount of stored charge. During an erase operation, the electrons return to the channel.

Each of the memory holes can be filled with a plurality of annular layers comprising a block oxide film, a charge trapping film, a tunneling film and a channel layer. A core region of each of the memory holes is filled with a body material, and the plurality of annular layers are between the core region and the WLLs in each of the memory holes.

FIG. 4B1 depicts a cross-section view of the region 246 of FIG. 4A along line 444. Each layer is ring-shaped, e.g., annular, in one possible approach, except the core filler, which is a cylinder.

FIG. 4B2 depicts a close-up view of the tunneling film 404 of FIG. 4B1, showing an oxide 404a, nitride 404b, oxide 404c configuration.

FIG. 4C depicts an expanded view of a region 410 of the NAND string of FIG. 3C2. When a program voltage is applied to the control gate of a memory cell via a respective word line, an electric field is generated. In MC0, the electric field causes electrons to tunnel into a region 470 of the charge-trapping film 403, from the channel 405. Similarly, for MC1, the electric field causes electrons to tunnel into a region 460 of the charge-trapping film 403, from the channel 405. The movement of the electrons into the charge-trapping film is represented by the arrows which point to the left. The electrons are represented by circles with a dash inside the circle.

When a memory cell on a selected word line is subsequently read back, control gate read voltages such as VreadA, VreadB and VreadC are applied to the memory cell while sensing circuitry determines whether the memory cell is in a conductive state. At the same time, a read pass voltage, Vread (e.g., 8-9 V), is applied to the remaining word lines.

In some cases, the accuracy of the read back operation can be impaired by charge loss in the memory cells. One type of charge loss involves de-trapping from the charge-trapping film. For example, an electron 452 is an example of a charge which has de-trapped from the charge-trapping region 470, lowering the Vth of MC0. An electron 453 is an example of a charge which remains in the charge-trapping region 470. Another type of charge loss involves de-trapping from the tunneling film. For example, an electron 452a is an example of a charge which has de-trapped from the tunneling film 404.

MC1 has a drain DR1b, a source SR1b and a control gate CG1.

Figure 5A:
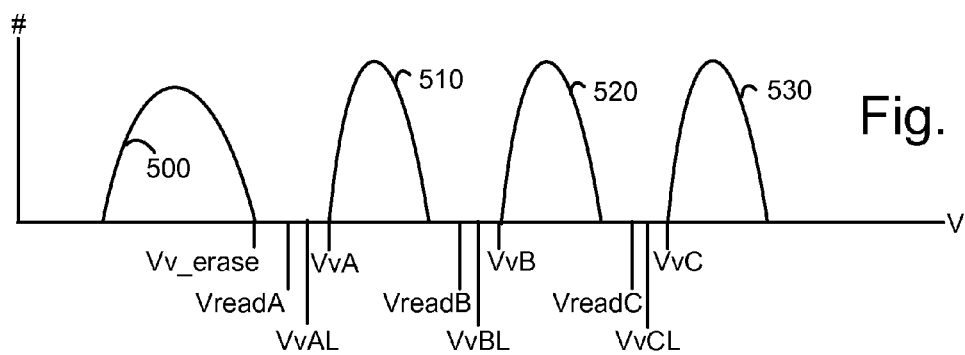
FIG. 5A depicts threshold voltage (Vth) distributions of a set of memory cells.

FIG. 5A depicts Vth distributions of a set of memory cells. The horizontal axis depicts Vth on a linear scale and the vertical axis depicts a number of memory cells on a logarithmic scale. A set of memory cells may be initially erased to an erased state Vth distribution 500 using a verify voltage of Vv_erase. Subsequently, when a command to program data is issued, the set of memory cells is programmed from the erased state to the target data states of A, B and C using verify voltages of VvA, VvB and VvC, respectively, in a four state memory device. In other cases, eight, sixteen or more data states are used. The erased state and the initial A, B and C states, after programming are represented by Vth distributions 500, 510, 520 and 530, respectively. Control gate read voltages such as VreadA, VreadB and VreadC are also depicted.

Optionally, offset verify voltages VvAL, VvBL and VvCL, which are lower than the final verify voltages, VvA, VvB and VvC, respectively, may be used. A memory cell which has a Vth below the offset verify voltage of its target data state may be in a fast programming mode in which its Vbl=0 V (Vbl_fast). A memory cell which has a Vth between the offset verify voltage and the final verify voltage of its target data state may be in a slow programming mode in which its Vbl is elevated above 0 V at a level (Vbl_slow, e.g., 0.5-1 V) which allows programming, and is below a level which inhibits programming. A memory cell which has a Vth above the final verify voltage of its target data state has its Vbl at a level (Vbl_inhibit, e.g., 2-3 V) which inhibits programming.

Figure 5B:
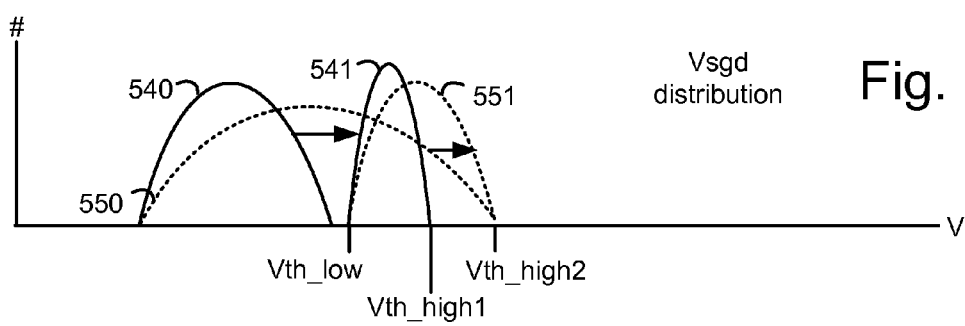
FIG. 5B depicts a Vth distribution of a select gate transistor, showing a wider Vth distribution when a channel film becomes inadvertently doped.

FIG. 5B depicts a Vth distribution of a select gate transistor, showing a wider Vth distribution when a channel film becomes inadvertently doped. The horizontal axis depicts Vth on a linear scale and the vertical axis depicts a number of select gate transistors on a logarithmic scale. As mentioned, due to elevated temperatures used during the fabrication, some of the dopants in the silicon cap can diffuse into the channel film adjacent to one or more select gate transistors of the NAND string, causing the different select gate transistors at the end of the NAND string to have different doping concentrations. This results in a widened Vth distribution and a corresponding reduced margin.

Specifically, the different doping concentration cause different intrinsic Vth levels for the select gate transistors. With more n-type doping, the Vth is lower. As a result, the intrinsic Vth distribution (distribution 550) for a set of select gate transistors with dopant diffusion into the channel film adjacent to one or more of the select gate transistors is widened compared to the case of no dopant diffusion into the channel film adjacent to one or more select gate transistors (distribution 540). Additionally, the select gate transistors may be programmed, particularly for the drain-side select gate (SGD) transistors in a 3D memory device. In some cases, the SGD transistors have their control gates tied together so that they are programmed together and the SGD transistors cannot be programmed to account for different amounts of dopant diffusion at different locations along the channel film.

For example, the Vth distribution 541 (which extends in a range from Vth_low to Vth_high1) is reached from the Vth distribution 540, and the Vth distribution 551 (which extends in a range from Vth_low to Vth_high2) is reached from the Vth distribution 550.

Figure 5C:
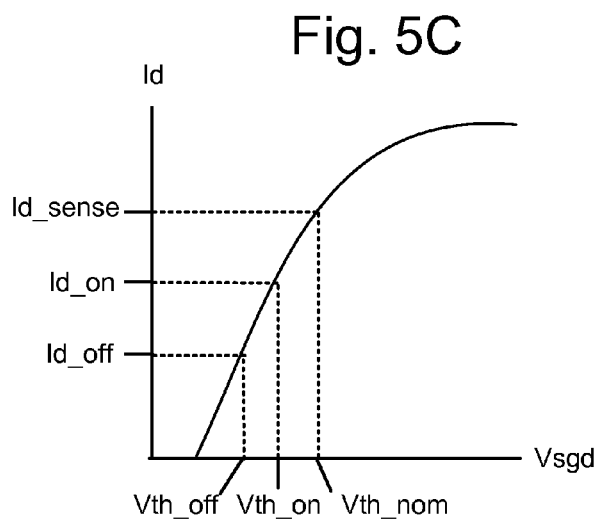
FIG. 5C depicts a plot of drain current (Id) versus control gate voltage (Vsgd) for a select gate transistor.

FIG. 5C depicts a plot of drain current (Id) versus control gate voltage (Vsgd) for a select gate transistor. An SGD transistor will be in a non-conductive state when the control gate voltage (Vsgd) of the SGD transistor is below a value Vth_off, and will be in a conductive state when Vsgd is above a value Vth_on. Further, during a sensing operation, Vsgd=Vth_nom, where Vth_nom>Vth_on to ensure the SGD transistor is fully conductive. A current of Id_off, Id_on or Isense flows in the SGD transistor and in the NAND string when Vsgd=Vth_off, Vth_on or Vth_nom, respectively.

Thus, the SGD transistors should be programmed to a specified range to allow them to function work properly. For example, to allow programming of a memory cell in a NAND string, an SGD transistor should be in a conductive state. Vsgd should provide a sufficiently high overdrive. The worst case is Vth=Vth_high and Vbl=Vbl_slow. Therefore: Vsgd>Vth_high+(Vth_on−Vth_nom)+Vbl_slow. To inhibit programming of a memory cell, an SGD transistor should be in a non-conductive state. Vsgd should provide a sufficiently low underdrive. The worst case is Vth=Vth_low. Therefore: Vsgd<Vbl_inhibit+Vth_low+(Vth_off–Vth_nom). Vsgd margin is therefore defined as Vbl_inhibit-Vbl_slow–(Vth_high–Vth_low)–(Vth_on–Vth_off). A wider SGD Vth distribution, e.g., Vth_high-Vth_low, therefore reduces the SGD margin. For example, the SGD margin is lower with Vth_high2 than with Vth_high1. Moreover, if the Vth of the SGD transistors becomes too high, it may be impossible to inhibit some of the fast programming memory cells, leading to a widened Vth distribution for a set of memory cells being programmed.

FIG. 6A depicts an example process for forming a memory device which avoids inadvertent doping of a channel film. Step 600 includes forming a stack of alternating control gate layers and dielectric layers. See, e.g., FIG. 8A. In one approach, the control gate layers comprise a sacrificial dielectric material such as SiN and the dielectric layers comprise densified Tetraethyl orthosilicate, e.g., Si(OC2H5)4 or dTEOS. Step 601 includes forming memory holes in the stack. See, e.g., FIG. 8B. For example, this can include depositing photoresist or other mask material on the stack, patterning the photoresist to form openings at desired locations in the stack and performing a dry etch to the bottom of the stack via the openings. The patterned mask is then removed. Step 602 includes depositing a charge-trapping film (e.g., SiN), a tunneling film (e.g., oxide or oxide-nitride-oxide) and a channel film (e.g., undoped amorphous silicon) in the memory holes. Chemical vapor deposition (CVD) may be used, for instance. See, e.g., FIG. 8C. Step 603 includes heating the structure to form polysilicon from the channel film. For example, the heating can be at 850 C for 30 minutes followed by a crystallization anneal at 1000 C for 30 seconds, such as in a furnace anneal. See, e.g., FIG. 8D. Step 604 includes depositing a dielectric core filler (e.g., silicon dioxide) in the memory holes. See, e.g., FIG. 8E. After step 603 and before step 604, portions of the films in the bottom of the memory hole may also be etched to allow a source contact to be formed.

Step 605 includes planarizing the structure. Generally, planarizing can include chemical-mechanical polishing (CMP) or etching, for example. For instance, a chlorine (Cl2) based etch chemistry can be used to remove Al or other metal of the dopant stopper liner, and a fluorine (F) based etch chemistry can be used to remove amorphous silicon of the cap. Other possible etch chemistries include Fluoroform (CHF3), Carbon monofluoride (CF, CFx, or (CF)x), and hot (e.g., 160 C) phosphoric acid (H3PO4). See, e.g., FIG. 8F. At this point, the dielectric core filler, the charge-trapping film, the tunneling film and a channel film extend to a height Ht at the top 814 of the stack. Step 606 includes depositing and patterning another mask with openings above the memory holes. See, e.g., FIG. 8G.

Step 607 includes etching back the dielectric core filler and optionally one or more films in the memory hole such as the channel film, the tunneling film and the charge-trapping film and to form a void. The dielectric core filler and the other film or films can be etched down to a height Hsg of the top 833 of the topmost control gate later in the stack. This control gate layer may be a select gate layer, for example. A dry etch may be used, for instance. See, e.g., FIGS. 8G and 9A.

Etching the dielectric core filler and the one or more films down to Hsg ensures that the size of the silicon cap is maximized without the silicon cap undesirably extending below the top of the topmost control gate layer. If the dielectric core filler is etched down lower than the top of the topmost control gate layer, it is possible that incidental etching of the channel film occurs. This reduces the thickness of the channel film and can possibly impair its performance.

The one or more films can be etched down to the same level as the dielectric core or to a higher level, e.g., between Hsg and Ht. For example, the level Hsg+d is higher than Hsg and lower than Ht. The forming the void can comprise providing an etch chemistry which is selective to the channel film separately from providing an etch chemistry which is selective to the dielectric core filler. For example, a first etch chemistry may initially etch the dielectric core filler, e.g., SiO2, after which a second etch chemistry etches the channel film, e.g., polysilicon.

Or, the dielectric core filler can be etched back without substantially etching back the channel film or other film. In this case, the etching back of the dielectric core filler can uses an etch chemistry which is selective to the dielectric core filler but not to the channel film. That is, the dielectric core filler but not the channel film is intentionally etched. The mask may also be sized to cover the channel film and other films to shield them from the etchant to avoid significant etching back of them. In these cases, even if a portion of the channel film is unintentionally etched, at least a portion of the channel film remains at a top of the stack after the etching back of the dielectric core filler. Ion implantation can be performed through this remaining top surface of the channel film.

After step 607, step 608 includes providing a dopant stopper liner in the void, e.g., using CVD. For example, the dopant stopper liner can include a metal such as Al, Cu, Ru, Ti, W, Ta or Co, or a metal nitride such as TiN, WN and TaN. Other examples include polysilicon doped with carbon, e.g., at a concentration of $10^{21}$ to $10^{22}$ atoms per cm3. The dopant stopper liner can be relatively thin, such as 2-3 nm thick. Due to the low resistivity of the dopant stopper liner and the silicon cap, a low resistivity path to and from the NAND string is formed. The dopant stopper liner should have a high conductivity while acting as a barrier to the migration of dopants in the silicon cap to the channel film. For example, some dopants such the p-type Boron have a low atomic weight and a high mobility so that they can easily diffuse within the silicon cap. The dopant stopper liner reduces or eliminates movement of the dopant outside the silicon cap, especially during a heating process.

Step 609 includes filling the void above the dopant stopper liner with n+ doped silicon, e.g., using CVD. In one approach, the silicon is in amorphous form. In another approach, it is in polysilicon form, or is converted to polysilicon in a subsequent heating process. The doping can occur in situ, e.g., as the silicon is deposited. The dopants can be p-type dopants such as Boron, Arsenic or Phosphorus which cause the silicon to become n-type. See, e.g., FIG. 8H.

Step 610 includes planarizing the structure such as using CMP or etching. For example, see FIG. 8I, before the addition of the mask and the ion implantation. Step 611 includes depositing and patterning a mask with openings. The openings are over and aligned with the silicon cap and, optionally, one or more films in the memory hole. Step 612 includes doping by ion implantation at the top of the silicon cap and optionally at the top of the channel film. This can reduce the resistance at the interface to the subsequently formed, overlying via. The implanted ions are p-type to make the implanted regions n-type. Optionally, the mask step and associated ion implantation of steps 611 and 612 can be omitted. Step 613 includes a heating step to activate the implanted dopants. For example, rapid thermal annealing at 900-1000 C for 10-30 seconds may be used. The heating generates vacancies which facilitate the movement of the dopants. This heating step and/or other heating steps can cause movement of the dopants in the silicon cap. However, as mentioned, the dopant diffusion stopper prevents the dopants within the silicon cap from reaching the channel film during heating.

Step 614 includes performing control gate layer processing, such as in FIG. 6B. Step 615 includes performing above-stack processing, such as in FIG. 6C.

FIG. 6B depicts example details of step 614 of FIG. 6A for performing control gate layer processing. Step 620 includes etching slits in the stack, as discussed previously, after forming an appropriate mask. The slits can be formed periodically in the stack near the memory holes. Step 621 includes removing the sacrificial material from the control gate layers to form horizontally-extending voids. For example, the SiN in the control gate layers may be removed using a wet etch. Step 622 includes depositing additional memory films such as a block oxide film, a hi-k film and a barrier metal film, followed by depositing a control gate metal in a remaining portion of the horizontally extending voids. For example, see FIG. 8J1. Optionally, the additional memory films are provided in the memory hole (e.g., as part of step 602) rather than in the control gate layer. For example, see FIG. 8J2.

FIG. 6C depicts example details of step 615 of FIG. 6A for performing above-stack processing. Step 630 includes depositing an etch stop layer on the stack, including above the top surface of the n+ doped silicon, e.g., using a blanket deposition. Step 631 includes depositing a first dielectric layer above the etch stop layer, e.g., using a blanket deposition, then forming a mask on the first dielectric layer. The first dielectric layer can be oxide or TEOS, for example. The etch stop layer may be a material such as SiN. For example, see FIG. 8K.

Step 632 includes patterning the first dielectric layer and then the etch stop layer, using an appropriate mask, to form pillar-shaped voids above the memory holes. For example, FIG. 8K depicts a patterned mask such as photoresist, and FIG. 8L depicts the structure after etching using the mask. An etch chemistry may be used which is initially selective of the oxide. The etch stop layer allows the etching of the oxide to stop at the same point across the stack even when the oxide may have different thickness across the stack due to slight non-uniformities which are inevitable during processing. Subsequently, an etch chemistry may be used which is selective of the etch stop layer. This allows the etching process to stop just below the etch stop layer with consistency across the stack.

Step 633 includes depositing a conductive material in the pillar-shaped voids, such as metal (e.g., W or Cu) or highly doped silicon (e.g., amorphous or polysilicon). For example, see FIG. 8M. This is the material that forms the body of the via. Step 634 includes planarizing the structure to form conductive vias in the voids, surrounded by the oxide. For example, see FIG. 8N. Step 635 includes depositing a second dielectric layer above the conductive vias and the first dielectric layer. The second dielectric layer can be oxide or TEOS, for example. Step 636 includes patterning the second dielectric layer to form trenches above the conductive vias. Step 637 includes depositing a conductive material such as metal in the trenches, e.g., in a blanket deposition. Step 638 includes planarizing to form horizontal bit lines in the trenches from the conductive material. For example, see FIG. 8N. As a result, a structure is formed in which the top portions of the memory holes are conductively coupled to overlying metal control lines.

FIG. 7A depicts a circuit diagram of a NAND string consistent with the memory devices of FIGS. 2C and 3C1. An example NAND string NS0A, consistent with FIG. 3C1 (or NS0 consistent with FIG. 2C), includes SGD transistors 701, 702 and 703, a drain-side dummy memory cell 704, data-storing memory cells 705, ..., 706, a source-side dummy memory cell 707, and SGS transistors 708, 709 and 710. A bit line 712 connects the drain end of the NAND string to sensing circuitry 700, which is used to sense the NAND string during operations involving the select gate transistors and the memory cells. A source line 711 is connected to a source end of the NAND string. Voltage drivers can be used to provide the voltages depicted. For example, Vsg is applied to the control gates of the SGD transistors, which are optionally connected to one another and to the control gates of the SGS transistors, which are optionally connected to one another. Vsg can also be applied to the dummy memory cells 704 and 707. During an erase operation, a common control gate voltage Vcg can be applied to each of the data-storing memory cells concurrently, in this example. During a programming operation, a program voltage Vpgm is applied to the selected word line and pass voltages are applied to the other word lines. Vbl is the bit line voltage and Vsl is the source line voltage. I_NAND is a sensed current in the NAND string. The current can be sensed during a verify test of an erase operation or a programming operation, as well as during a read operation in which the data states of the memory cells are determined.

FIG. 7B depicts a circuit diagram of the memory cell 706 of FIG. 7A. The memory cell includes a number of terminals including a drain (D) terminal which may have a voltage Vbl, a source (S) terminal which may have a voltage Vsl, a control gate (CG) terminal which may have a voltage Vcg and a channel (CH) terminal which may have a voltage Vch.

Figure 8A:
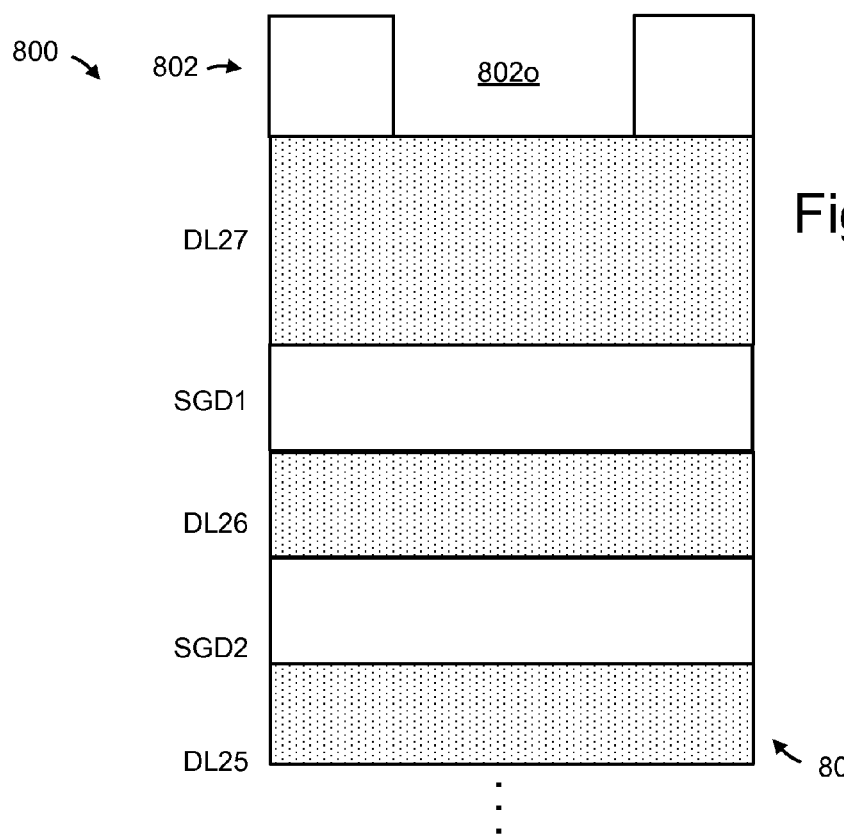
FIG. 8A depicts a structure in which a mask is provided above a stack, consistent with step 600 of the process of FIG. 6A.

FIG. 8A depicts a structure 800 in which a mask 802 is provided above a stack 801, consistent with step 600 of the process of FIG. 6A. An opening 802o is formed by the mask which is used to etch a memory hole. In practice, a number of memory holes can be formed concurrently in a stack. A singe memory hole is depicted for clarity. Additionally, in the stack, a few dielectric layers, e.g., DL25, DL26 and DL27 are depicted along with a few control gate layers, e.g., SGD2 and SGD1, consistent with FIG. 3C1, for instance. The remaining layers are not depicted for clarity and to better show details in the upper part of the stack.

Figure 8B:
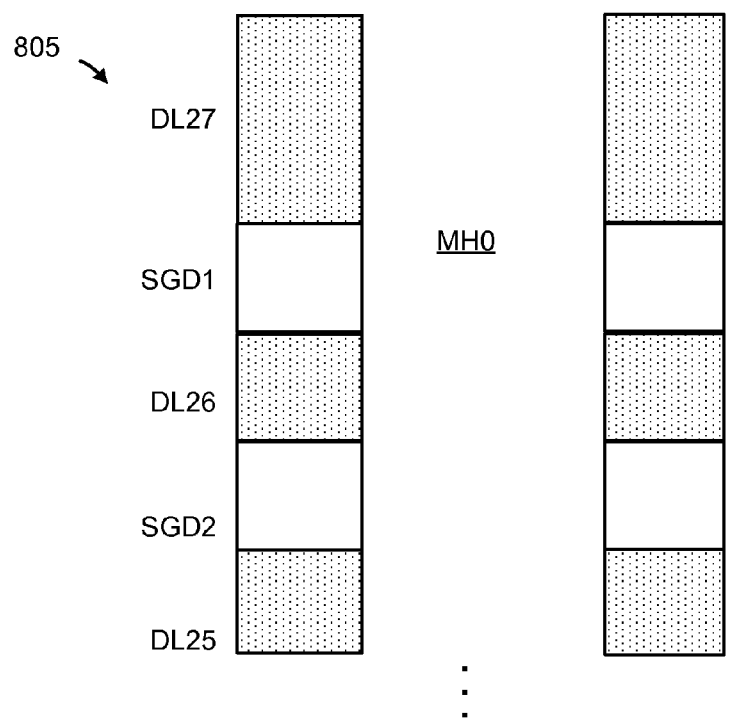
FIG. 8B depicts a structure in which a memory hole is formed in the stack of FIG. 8A, consistent with step 601 of the process of FIG. 6A.

FIG. 8B depicts a structure 805 in which a memory hole MH0 is formed in the stack of FIG. 8A, consistent with step 601 of the process of FIG. 6A. The remaining portion of the mask has been removed.

Figure 8C:
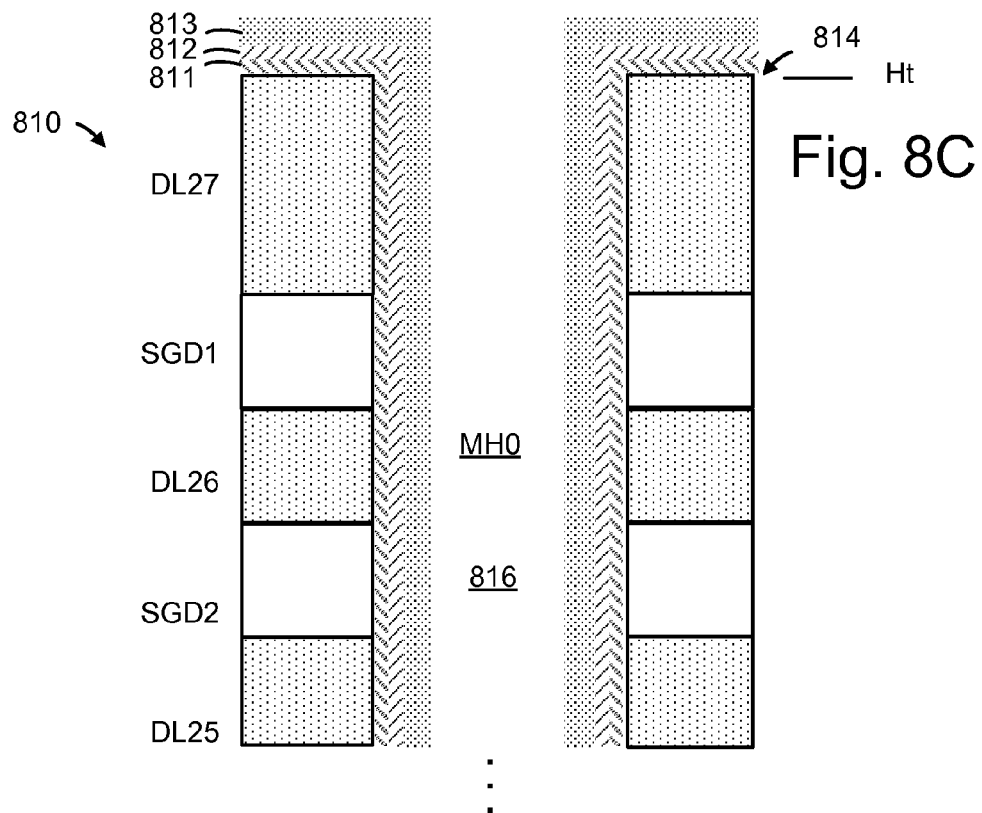
FIG. 8C depicts a structure in which a charge-trapping film, a tunneling film and a channel film are deposited in the memory hole of the structure of FIG. 8B, consistent with step 602 of the process of FIG. 6A.

FIG. 8C depicts a structure 810 in which a charge-trapping film 811, a tunneling film 812 and a channel film 813 are deposited, in turn, in the memory hole MH0 of the structure of FIG. 8B, consistent with step 602 of the process of FIG. 6A. The films may extend up to a top 814 of the memory hole at a height Ht and overlay the stack. A central void 816 in the vertically-extending memory hole is formed within the channel film 813.

Figure 8D:
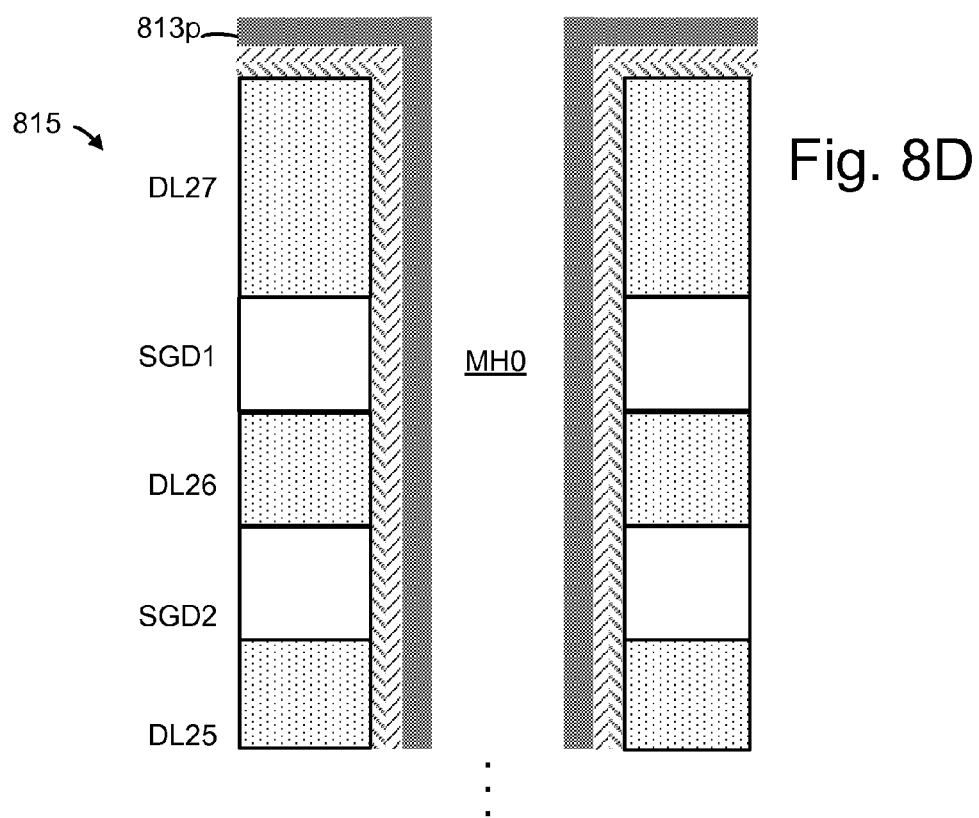
FIG. 8D depicts a structure in which a polysilicon channel film is formed by heating the structure of FIG. 8C, consistent with step 603 of the process of FIG. 6A.

FIG. 8D depicts a structure 815 in which a polysilicon channel film 813p is formed by heating the structure of FIG. 8C, consistent with step 603 of the process of FIG. 6A. The heating converts the amorphous silicon of the channel film into polysilicon.

Figure 8E:
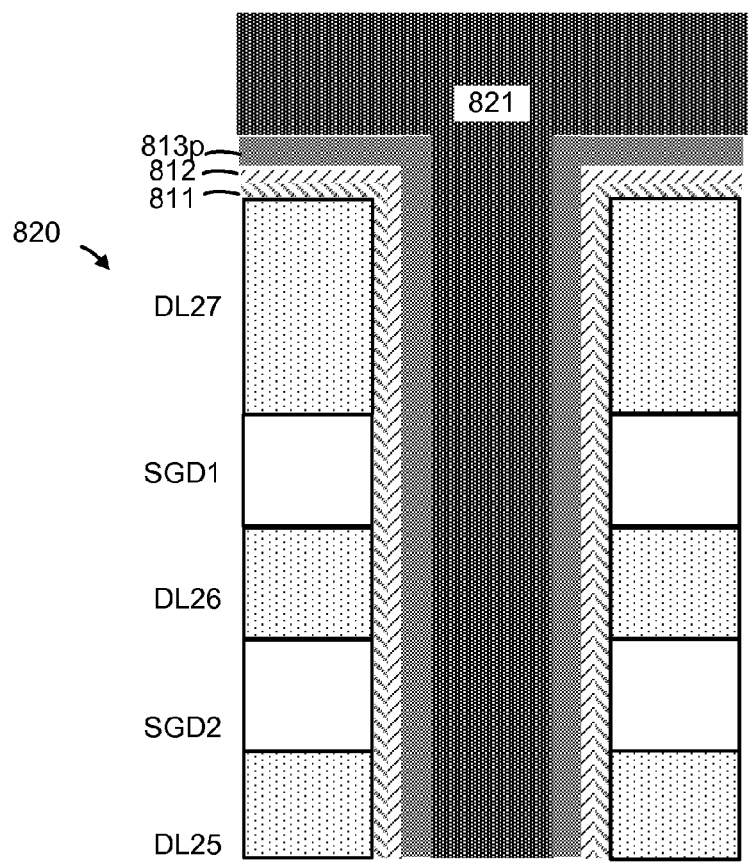
FIG. 8E depicts a structure in which a dielectric core filler is deposited in the memory hole of the structure of FIG. 8D, consistent with step 604 of the process of FIG. 6A.

FIG. 8E depicts a structure 820 in which a dielectric core filler 821 is deposited in the memory hole of the structure of FIG. 8D, consistent with step 604 of the process of FIG. 6A. The dielectric core filler fills a central region of the memory hole and is adjacent to the channel film, in one approach.

Figure 8F:
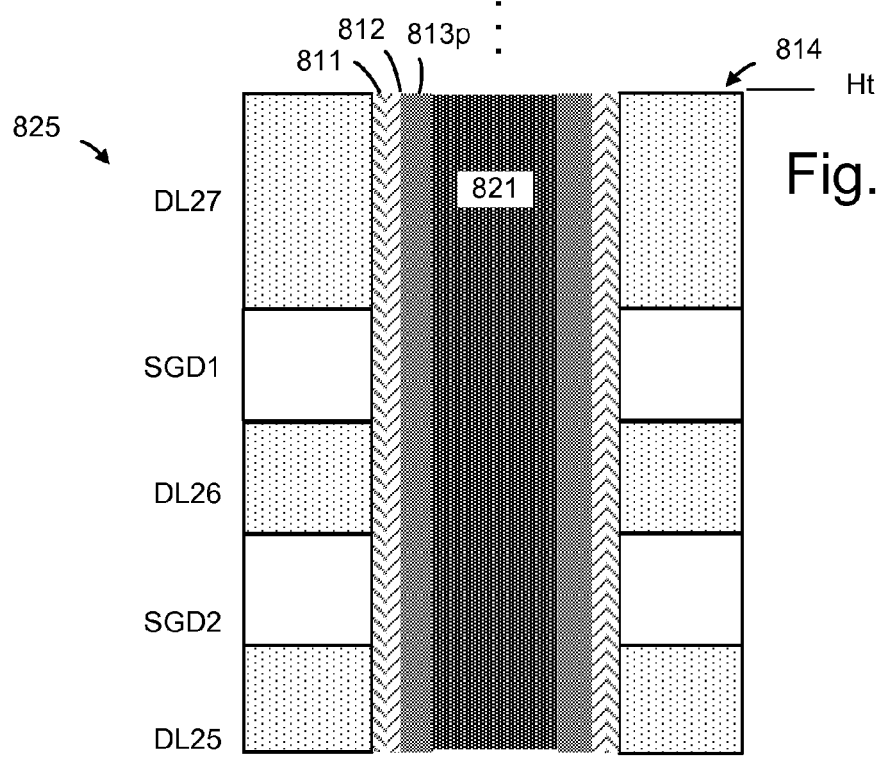
FIG. 8F depicts a structure which is formed by planarizing the structure of FIG. 8E, consistent with step 605 of the process of FIG. 6A.

FIG. 8F depicts a structure 825 which is formed by planarizing the structure of FIG. 8E, consistent with step 605 of the process of FIG. 6A. The dielectric core filler 821, the channel film 813p, the tunneling film 812 and the charge-trapping layer 811 now extend uniformly to the top 814 of the stack.

Figure 8G:
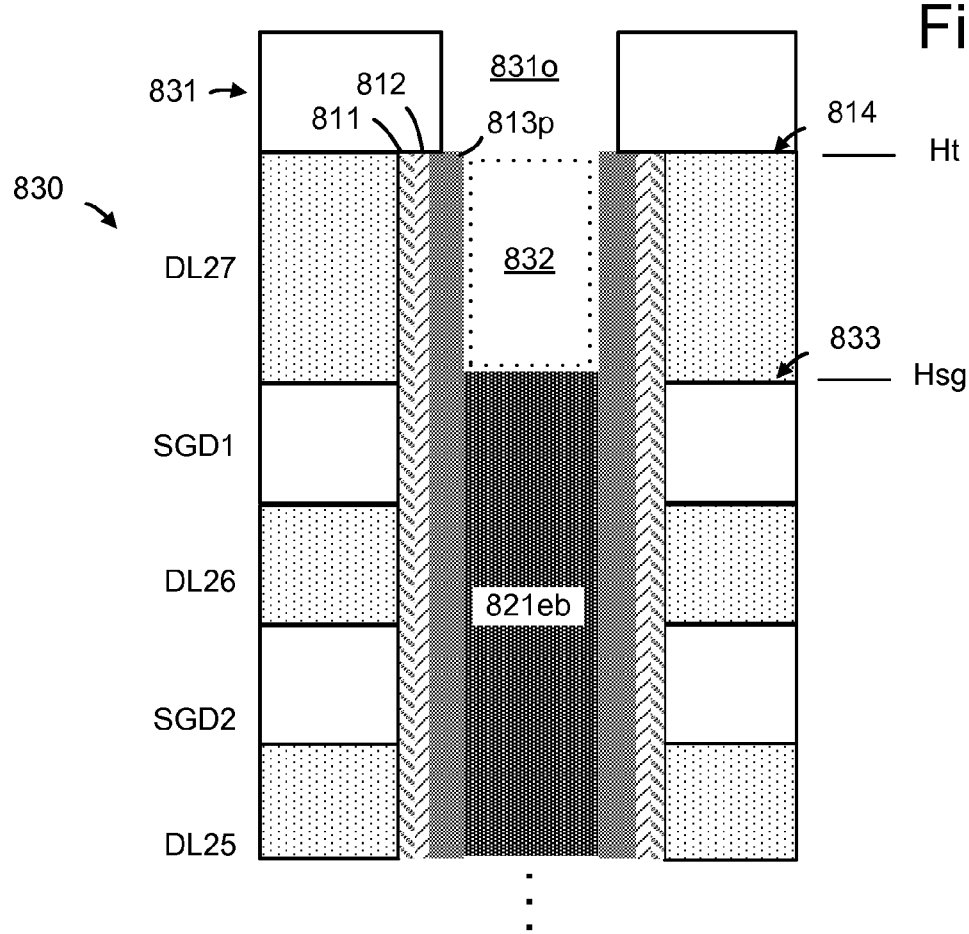
FIG. 8G depicts a structure which is formed by providing a mask and etching back the dielectric core filler but not the channel film of FIG. 8F to form a void, consistent with step 607 of the process of FIG. 6A.

FIG. 8G depicts a structure 830 which is formed by providing a mask 831 and etching back the dielectric core filler 821 (to provide an etched back dielectric core filler 821eb) but not the channel film 813p of FIG. 8F to form a void 832, consistent with step 607 of the process of FIG. 6A. The channel film may be slightly etched on its inner face but the etching chemistry is selective of the dielectric core filler and not the channel film, so that the channel film is not uniformly etched back from its top surface downward. Note that the opening 831o in the mask is positioned to encompass the dielectric core filler and may encompass one or more of the films on the inner surface of the memory hole. The dielectric core filler may be etched back to a height Hsg at the top of the topmost control gate layer, SGD1.

Now that in FIG. 8G and other figures, the thickness of the dielectric core filler is depicted as being about $\frac{1}{3}$-$\frac{1}{4}^{th}$ the diameter of the dielectric core filler. However, the thickness of the dielectric core filler may be a larger fraction (e.g., $\frac{1}{2}$) of the diameter of the dielectric core filler. In this case, it is easier to mask the channel film with a given mask accuracy. Moreover, generally the opening in the mask should be placed to ensure that the dielectric core filler is etched back across its entire width since any portion of the dielectric core filler which remains above Hsg would undesirably block current.

Figure 8H:
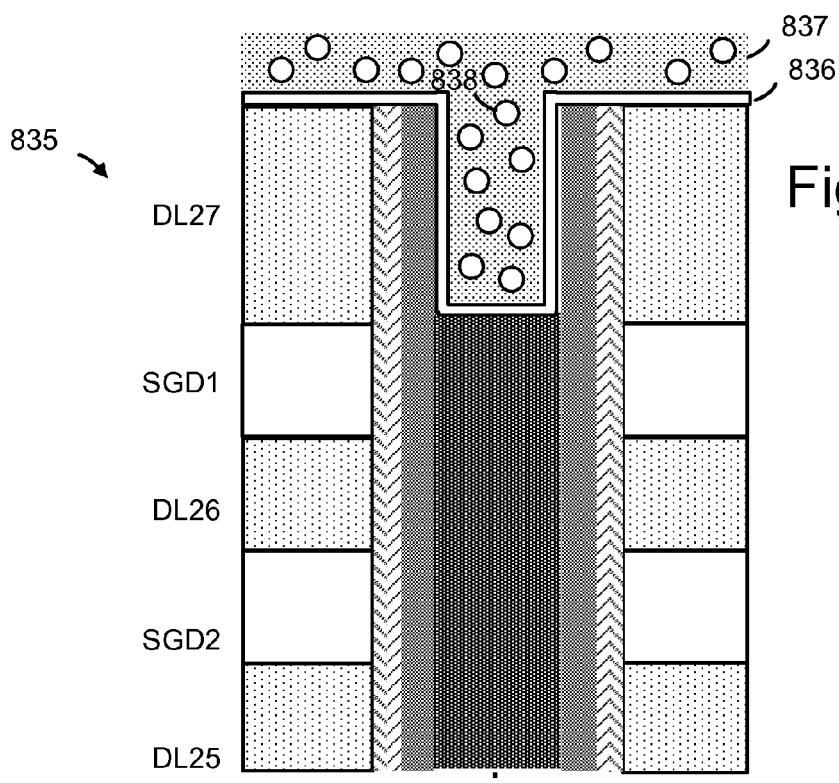
FIG. 8H depicts a structure which is formed by providing a dopant stopper liner in the void of the structure of FIG. 8G and filling the void with n+ doped silicon, consistent with steps 608 and 609 of the process of FIG. 6A.

FIG. 8H depicts a structure 835 which is formed by providing a dopant stopper liner 836 in the void of the structure of FIG. 8G and filling the void with n+ doped silicon 837, consistent with steps 608 and 609 of the process of FIG. 6A. Example dopants 838 are depicted by white circles (not to scale). The liner and silicon may be deposited using blanket depositions.

Figure 8I:
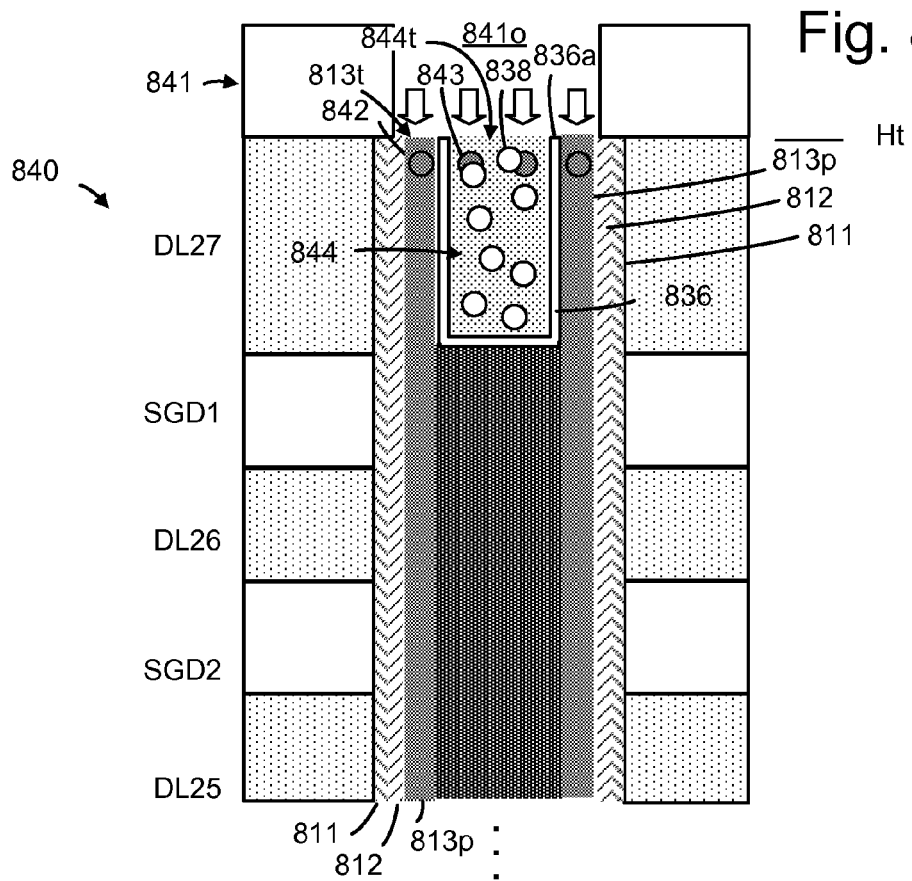
FIG. 8I depicts a structure 840 which is formed by planarizing the structure of FIG. 8H, depositing and patterning a mask, performing ion implantation and heating to activate dopants, consistent with steps 610-613 of the process of FIG. 6A.

FIG. 8I depicts a structure 840 which is formed by planarizing the structure of FIG. 8H, depositing and patterning a mask, performing ion implantation and heating to activate dopants, consistent with steps 610-613 of the process of FIG. 6A. A mask 841 is formed by depositing and patterning a mask material so that an opening 841o is formed which is aligned with the memory hole and exposes the top surface 844t of the silicon cap and one or more films such as the channel film 813p. The remaining portion of the doped silicon forms a silicon cap 844 which conforms to the shape of the dopant stopper liner 836 and extends up to a height Ht of the top surface of the stack. The mask is used to mask out areas of the stack outside the memory holes which are not to receive ion implantation. The implanted ions, or dopants (shown as dark circles) include dopants 842 which enter the channel film 813p and dopants 843 which enter the silicon cap. The ion implantation can be performed through the top surface 844t of the silicon cap 844 and the top surface 813t of the channel film 813p, for instance.

The heating activates the dopants and can cause movement or diffusion of the dopants. As mentioned, the dopant stopper liner contains the dopants within the silicon cap. The dopants in the channel film may diffuse downward but the implantation depth can be controlled so that there is little risk of the dopants reaching the top control gate layer during the heating.

In this cross-sectional view, the silicon cap and the dopant stopper liner are shown as having squared off bottom corners and vertical walls. In practice, a rounded bottom profile and sloped walls may be experienced.

FIG. 8J1 depicts a structure 845 which is formed from the structure of FIG. 8I by performing control gate layer processing, consistent with step 614 of the process of FIG. 6A and with FIG. 6B. The processing included removing the sacrificial material in the control gate layers followed by depositing a block oxide film 846, a hi-k film 847, a barrier metal film 848 and finally a metal 849 which provides the conductive material for the control gate.

FIG. 8J2 depicts a structure 850 which is an alternative to FIG. 8J1 in which the control gate layer processing of step 613 of the process of FIG. 6A involves replacing a sacrificial material with a metal 849 while a block oxide film 846a and a high-k film 847a are in the memory hole rather than in the control gate layer.

FIG. 8K depicts a structure 855 which is formed from the structure of FIG. 8J1 using steps 630 and 631 of FIG. 6C. The etch stop layer 856 is deposited on the top 814 of the stack, the first dielectric layer 857 is deposited on the etch stop layer, and a mask material is deposited and patterned on the first dielectric layer to form a mask 858 with an opening 858o over and aligned with the memory hole.

FIG. 8L depicts a structure 860 which is formed from the structure of FIG. 8K using step 632 of FIG. 6C. An opening 857o is formed within the remaining portions 857a of the first dielectric to expose the top surface 844t of the silicon cap 844 and optionally the top surface 813t of the channel film and one or more other films in the memory hole at the height Ht. The etch through the etch stop layer should cleanly remove all of the etch stop layer above the silicon cap. Any remaining portions of the etch stop layer above the silicon cap could increase the resistance in the conductive path through the via which is subsequently formed. Remaining portions of the etch stop layer 856a which are below the remaining portions 857a of the first dielectric are also depicted.

FIG. 8M depicts a structure 865 which is formed from the structure of FIG. 8L using step 633 of FIG. 6C. The conductive material 866 fills opening 857o and overflows onto the remaining portions 857a of the first dielectric.

Figure 8N:
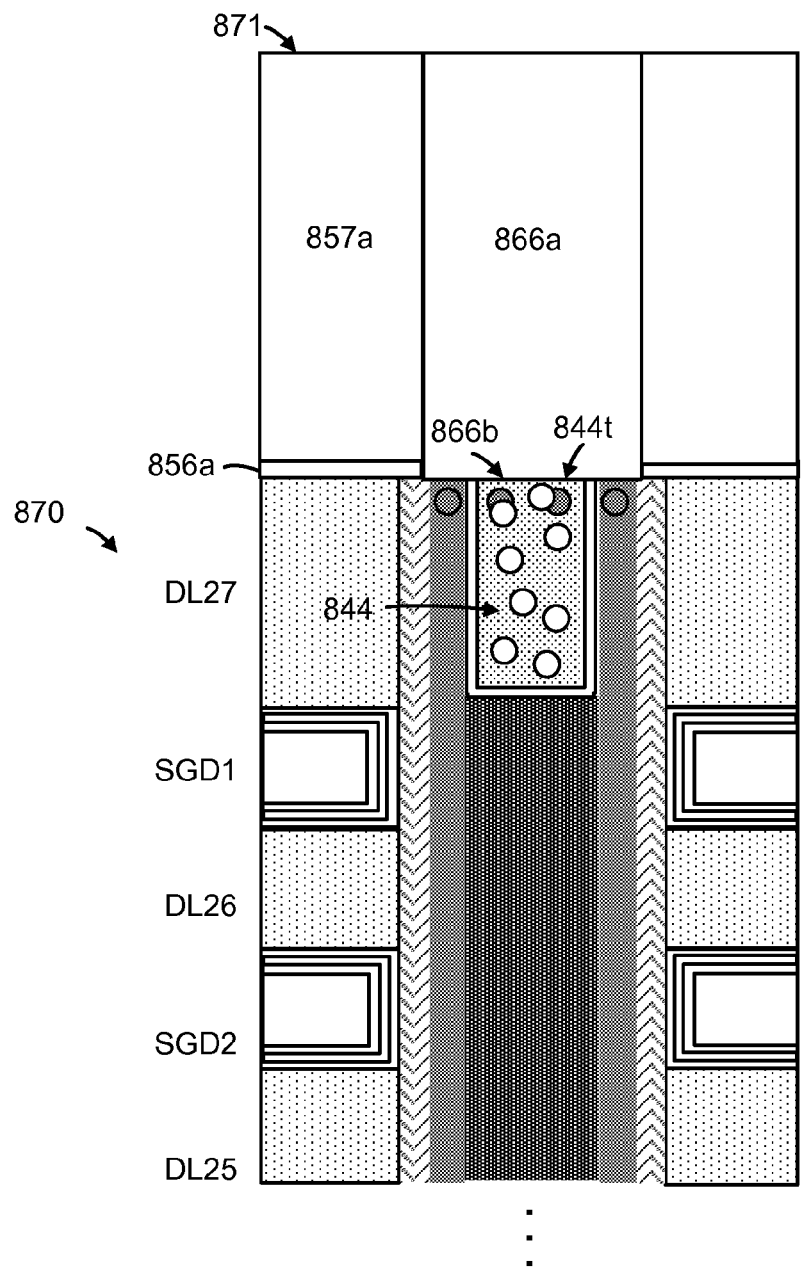
FIG. 8N depicts a structure which is formed from the structure of FIG. 8M using step 634 of FIG. 6C.

FIG. 8N depicts a structure 870 which is formed from the structure of FIG. 8M using step 634 of FIG. 6C. The structure is planarized to remove the excess conductive material and make it even with the top surface 871 of the remaining portions 857a of the first dielectric. The remaining conductive material forms a pillar-shaped via 866a. The conductive via has a bottom surface 866b which rests on the top surface 844t of the n+ doped silicon cap 844. For example, the bottom surface 866b may contact, e.g., touch, the top surface 844t. Or, one or more other conductive layers can be provided between the bottom surface 866b and the top surface 844t.

Figure 8O:
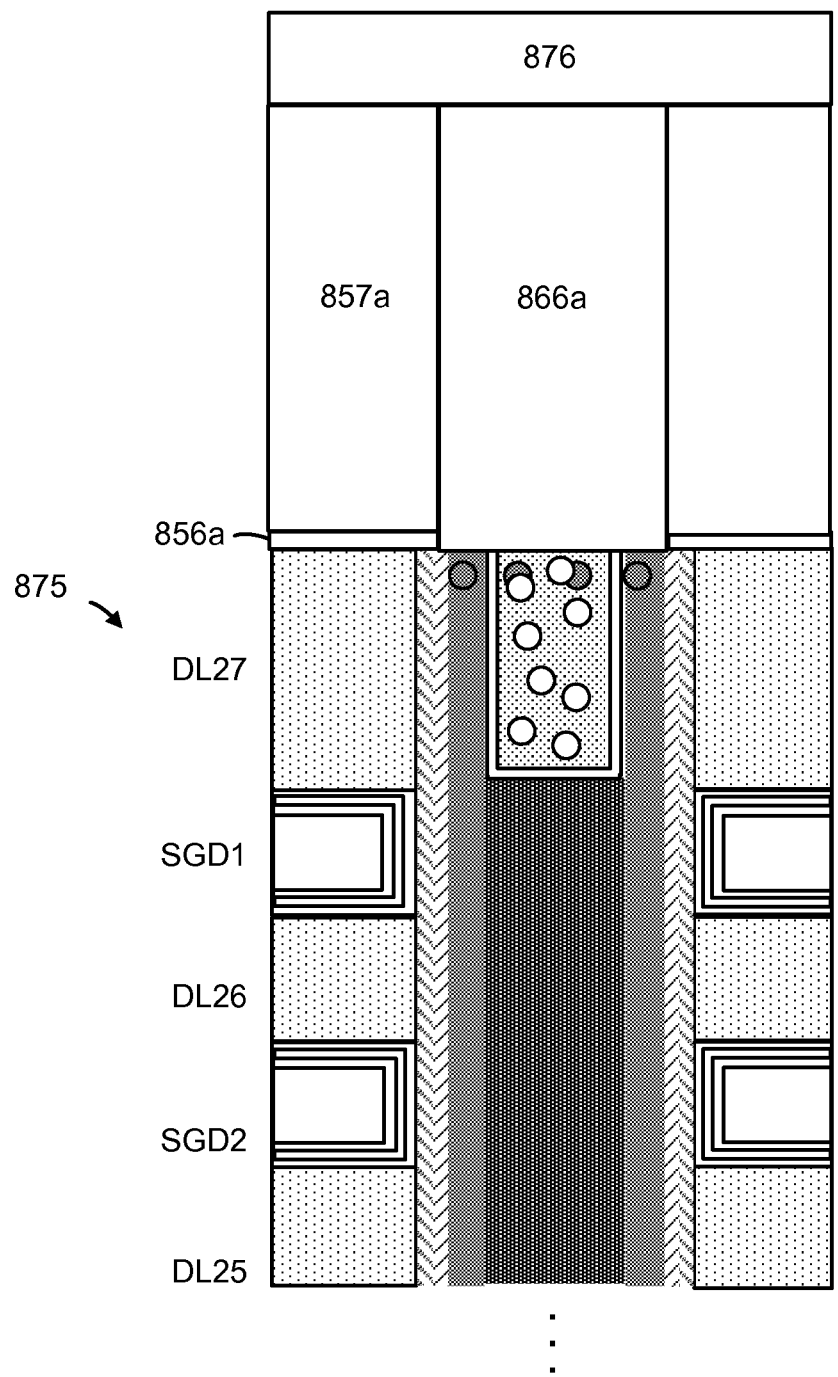
FIG. 8O depicts a structure which is formed from the structure of FIG. 8N using steps 635-638 of FIG. 6C.

FIG. 8O depicts a structure 875 which is formed from the structure of FIG. 8N using steps 635-638 of FIG. 6C. The structure includes a bit line or other conductive line which extends above and is in contact with the via 866a. An electrical signal on the bit line can therefore be communicated to the silicon cap of the memory hole through the via 866a. The electrical signal is communicated in turn from the silicon cap through the dopant stopper line and to the channel film.

Figure 8P:
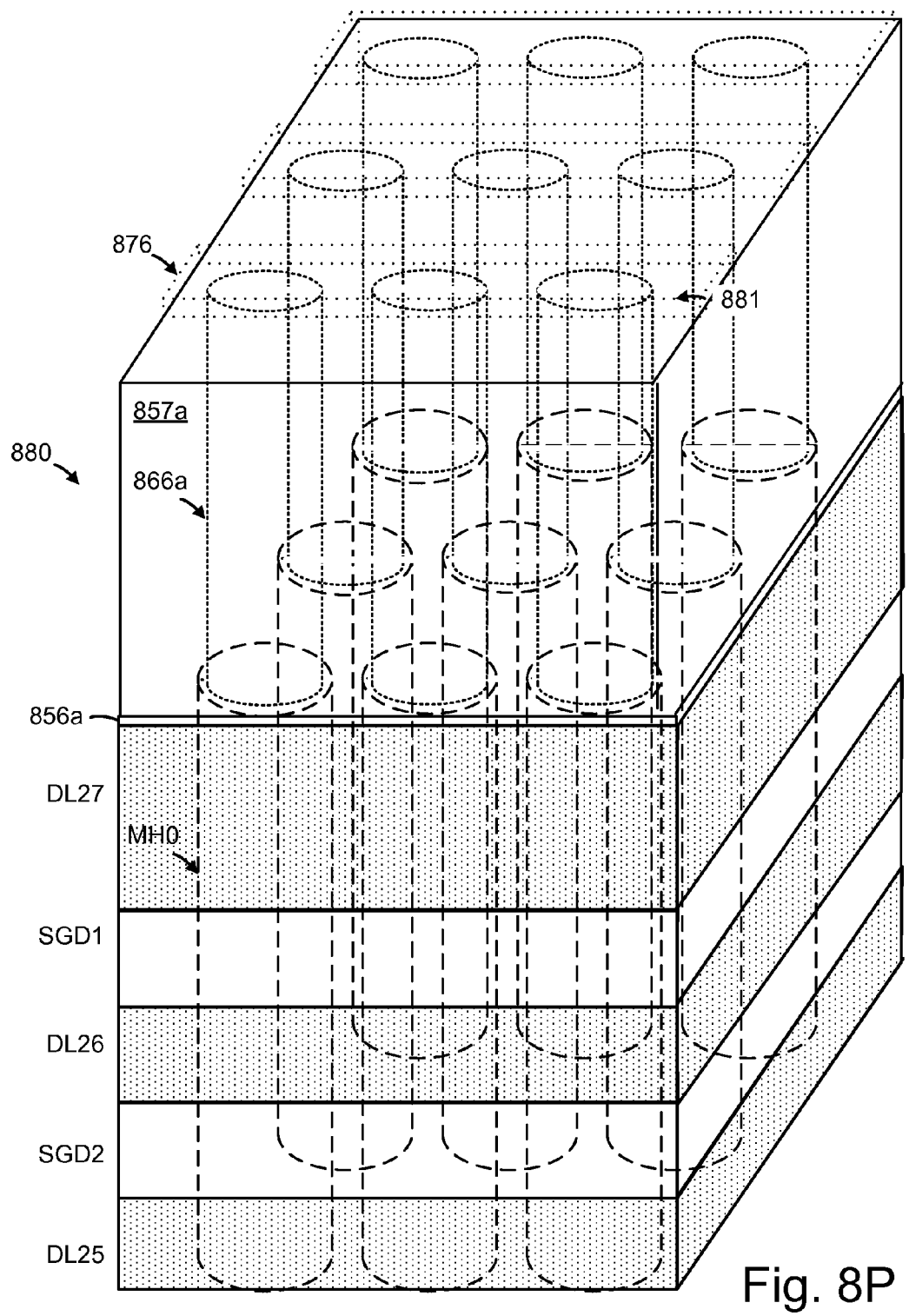
FIG. 8P depicts a structure comprising rows of memory holes and vias such as depicted in FIG. 8O.

FIG. 8P depicts a structure 880 comprising rows of memory holes and vias such as depicted in FIG. 8O. The bit line 876, via 866a and memory hole MH0 from FIG. 8O are repeated along with a number of similar structures. A bit line may communicate with a number of vias in a row 881 of vias. Additional bit lines extend behind the bit line 876 in additional rows of vias and memory holes. The dielectric core filler is etched back to provide the etched back dielectric core filler 821eb as in FIG. 8G. The channel film 813p is etched back to provide the etched back channel film 813eb.

Optionally, the vias can have a shape other than pillar-shaped. For example, a via an extend across multiple silicon caps, e.g., in a rail shape.

Figure 9A:
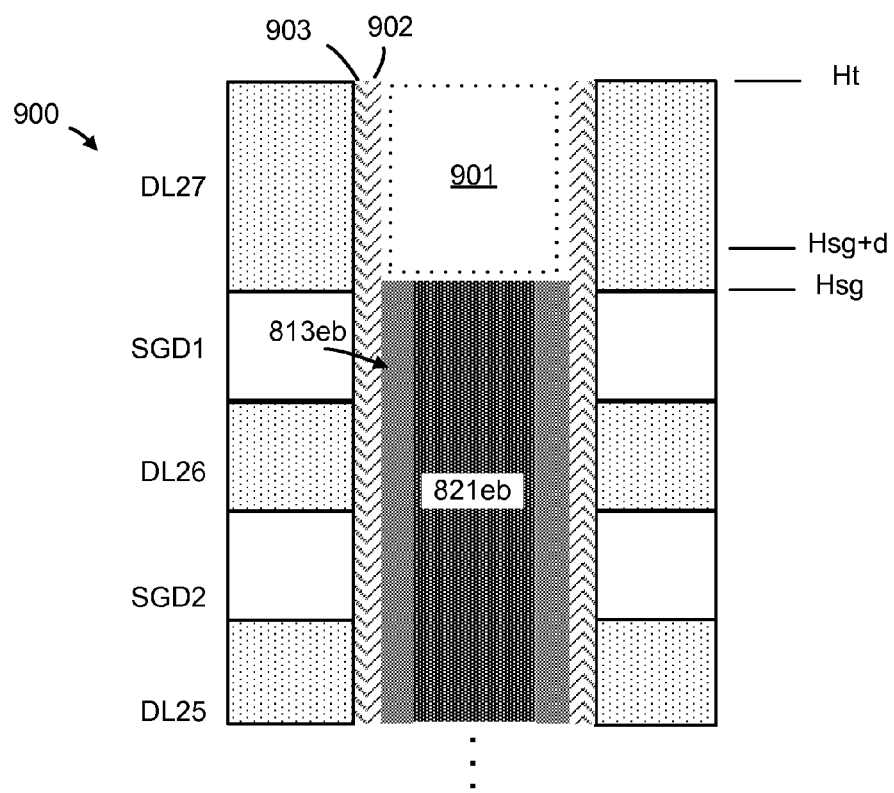
FIG. 9A depicts a structure which is formed by providing a mask and etching back the dielectric core filler and the channel film to form a void, consistent with step 607 of the process of FIG. 6A.

FIG. 9A depicts a structure 900 which is formed by providing a mask and etching back the dielectric core filler and the channel film to form a void 901, consistent with step 607 of the process of FIG. 6A. As mentioned, both may be etched back to a height of Hsg or the channel film may be etched back to a higher height of Hsg+d. The tunneling film 902 and charge-trapping film 903 are also depicted. The structure before this step can be similar to FIG. 8F.

Figure 9B:
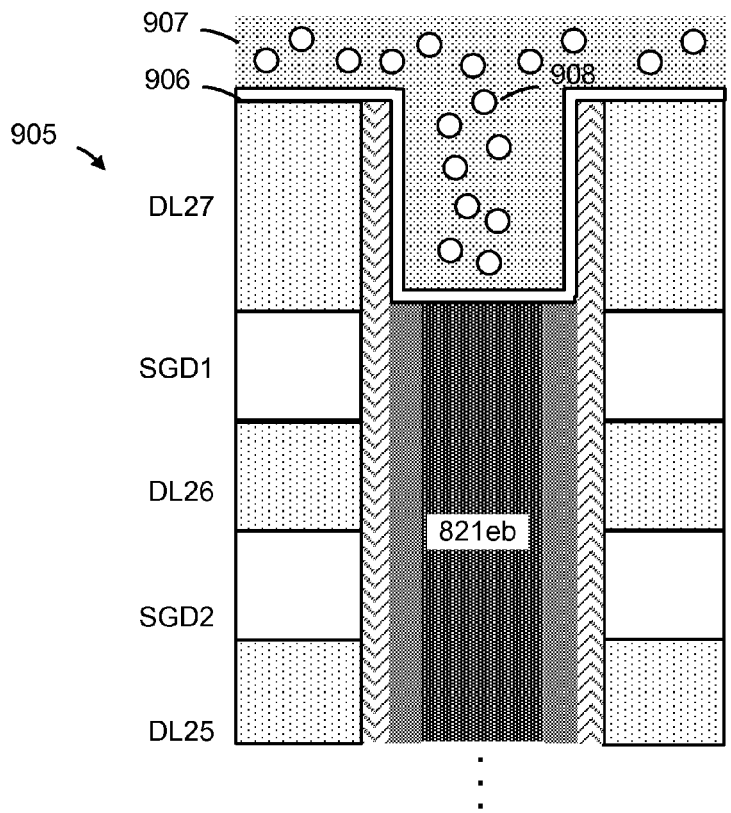
FIG. 9B depicts a structure which is formed by providing a dopant stopper liner in the void of the structure of FIG. 9A and filling the void with n+ doped silicon, consistent with steps 608 and 609 of the process of FIG. 6A.

FIG. 9B depicts a structure 905 which is formed by providing a dopant stopper liner 906 in the void of the structure of FIG. 9A and filling the void with n+ doped silicon 907 (with example dopants 908), consistent with steps 608 and 609 of the process of FIG. 6A. The dopant stopper liner extends along the tunneling film 902 in this case.

Figure 9C:
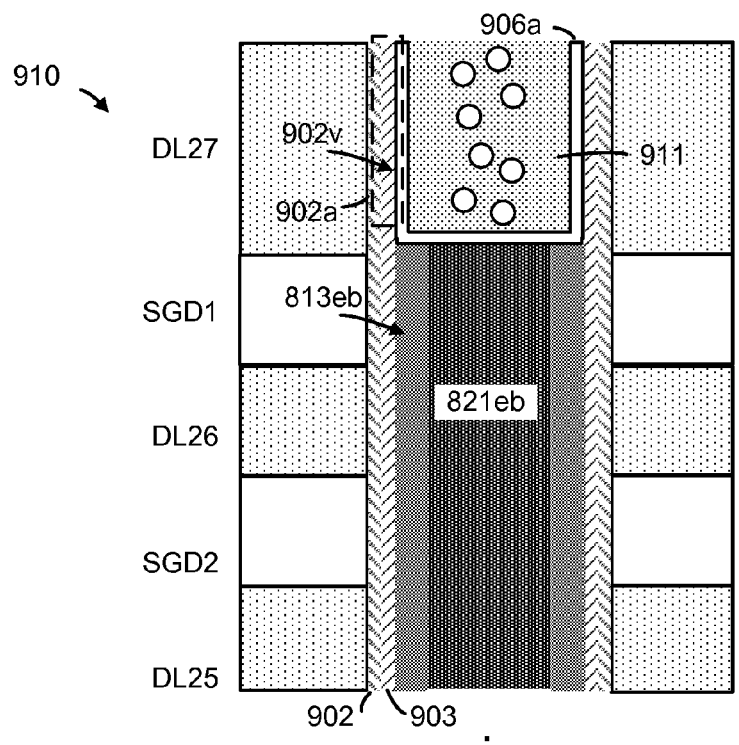
FIG. 9C depicts a structure which is formed by planarizing the structure of FIG. 9B, consistent with step 610 of the process of FIG. 6A.

FIG. 9C depicts a structure 910 which is formed by planarizing the structure of FIG. 9B, consistent with step 610 of the process of FIG. 6A. As before, dopants in the n+ silicon are prevented from entering the channel film by the dopant stopper liner. A silicon cap 911 is therefore formed in a remaining portion 906a of the dopant stopper liner. Although the channel film 813eb is etched back, the next film, e.g., the annular tunneling film 902 may not be etched back, in one approach. In this case, the annular tunneling film extends up to the top of the stack such that a vertical surface 902v of a topmost portion 902a of the annular tunneling film is above the annular channel film 813eb and the dielectric core filler 821eb. The annular channel film is within the annular tunneling film. The remaining portion 906a of the dopant stopper liner extends upwardly to the top of the stack on the vertical surface of the topmost portion of the annular tunneling film.

Figure 9D:
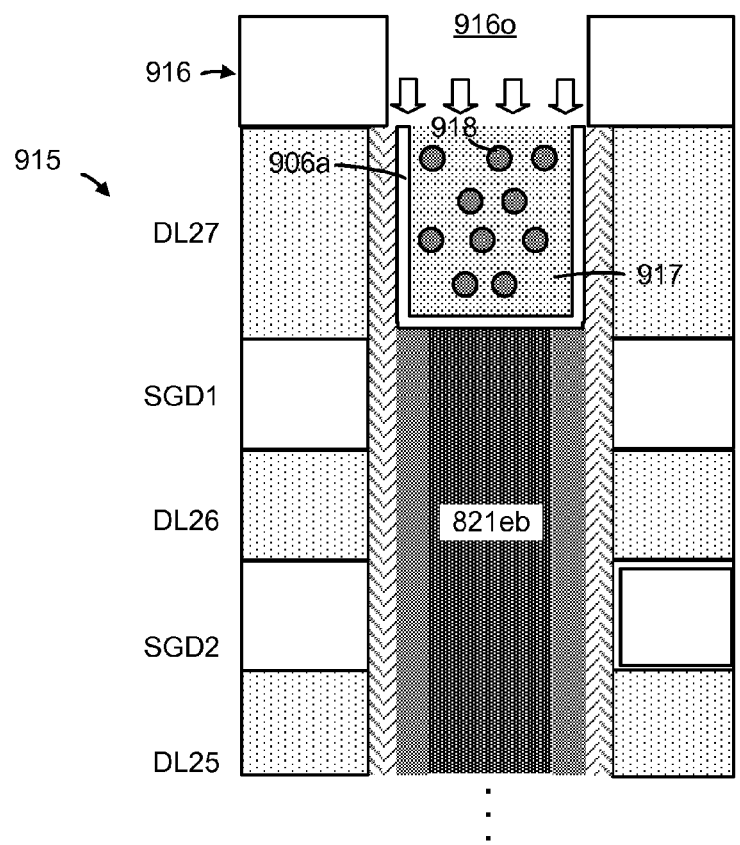
FIG. 9D depicts a structure which is formed by planarizing the structure of FIG. 9B, forming a mask and performing ion implantation into the silicon cap, consistent with step 612 of the process of FIG. 6A.

FIG. 9D depicts a structure 915 which is formed by planarizing the structure of FIG. 9B, forming a mask 916 (with an opening 916o) and performing ion implantation into the silicon cap 917, consistent with step 612 of the process of FIG. 6A. Example dopants 918 are provided in the silicon cap. The ion implantation can include deeper implantations than in FIG. 8I, for example, to provide the dopants uniformly in the silicon cap rather than near a top surface of the silicon cap. The ion implantation can be performed as an alternative or addition to in situ doping of the silicon. That is, undoped silicon may be deposited to form the cap, after which ion implantation causes the silicon cap to become n+. Or, n+ doped silicon may be deposited to form the cap, after which ion implantation causes the silicon cap to become more strongly n-type. The via and bit line can be formed above the structure as discussed previously.

Figure 10:
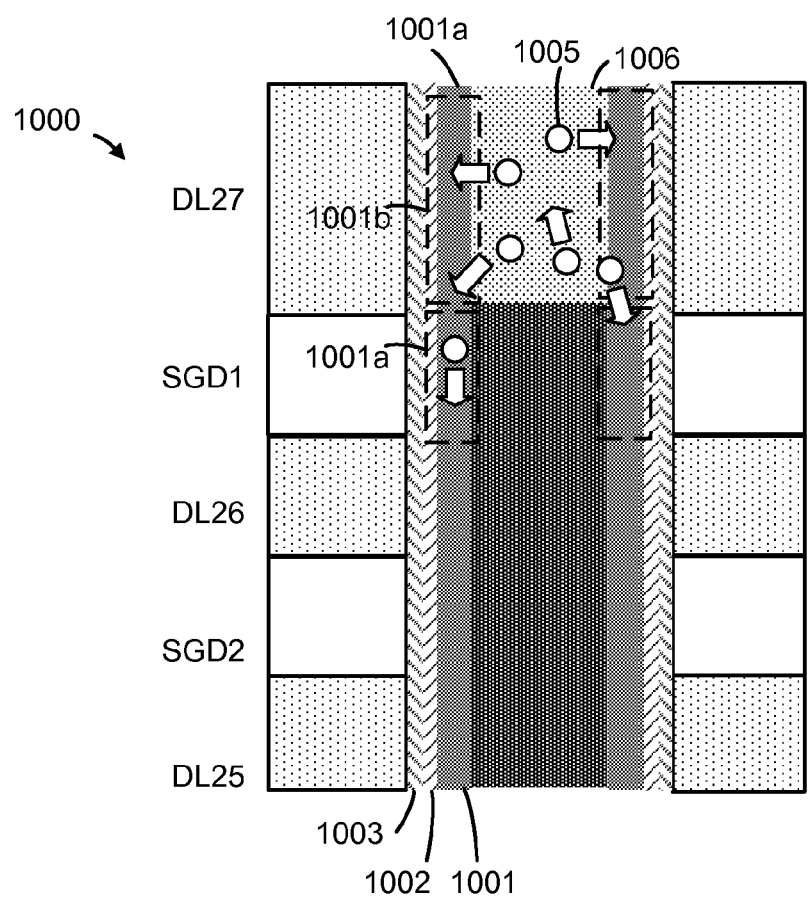
FIG. 10 depicts a comparative structure 1000 which dopants in the n+ silicon cap enter a portion of the channel film which is adjacent to the topmost control gate layer SGD1 due to the lack of a dopant stopper liner.

FIG. 10 depicts a comparative structure 1000 in which dopants 1005 in the n+ silicon cap 1006 enter a portion 1001a of the channel film 1001 which is adjacent to the topmost control gate layer SGD1 due to the lack of a dopant stopper liner. As mentioned, these dopants impair the operation of the select gate transistors associated with SGD1. The dopants can also enter a portion 1001b of the channel film 1001 which is above the topmost control gate layer SGD1. The tunneling film 1002 and the charge-trapping film 1003 are also depicted.

Accordingly, it can be seen that, in one embodiment, a method for fabricating a contact in a memory device comprises: forming a vertically-extending memory hole in a stack, the stack comprising alternating control gate layers and dielectric layers; providing a channel film in the vertically-extending memory hole, a central void in the vertically-extending memory hole is formed within the channel film; providing a dielectric core filler in the central void; forming a void in the vertically-extending memory hole, the forming the void comprises etching back the dielectric core filler to provide an etched back dielectric core filler; providing a dopant stopper liner in the void, the dopant stopper liner is conductive and extends upward from a top surface of the etched back dielectric core filler to a top of the stack; providing n+ doped silicon in the void, above the dopant stopper liner, the n+ doped silicon conforms to the dopant stopper liner; and providing a conductive via which extends above the stack, the conductive via has a bottom surface which rests on a top surface of the n+ doped silicon.

In another embodiment, a memory device comprises: a stack, the stack comprising alternating control gate layers and dielectric layers; a pillar in the stack, the pillar comprises an annular channel film and a dielectric core filler within the annular channel film, the annular channel film extends up to a top of the stack and the dielectric core filler extends up to a height which is below the top of the stack, such that a topmost portion of the annular channel film is above the dielectric core filler; a conductive dopant stopper liner which extends upward from a top surface of the dielectric core filler and along the topmost portion of the annular channel film to the top of the stack; and n+ doped silicon above the dopant stopper liner, the n+ doped silicon conforms to the dopant stopper liner, and a top surface of the n+ doped silicon is at the top of the stack.

In another embodiment, a memory device comprises: a stack, the stack comprising alternating control gate layers and dielectric layers; a pillar in the stack, the pillar comprises an annular channel film and a dielectric core filler within the annular channel film, the annular channel film and the dielectric core filler extend up to a height which is below a top of the stack; a conductive dopant stopper liner which extends upward from a top surface of the annular channel film and a top surface of the dielectric core filler to the top of the stack; and n+ doped silicon above the dopant stopper liner, the n+ doped silicon conforms to the dopant stopper liner, and a top surface of the n+ doped silicon is at the top of the stack.

In another embodiment, a memory device comprises: a stack, the stack comprising alternating control gate layers and dielectric layers; a pillar in the stack, the pillar comprises an annular channel film and a dielectric core filler within the annular channel film, the annular channel film extends up at least to a top of a topmost control gate layer, and the dielectric core filler extends up to the top of the topmost control gate layer but below the top of the stack; a conductive dopant stopper liner which extends upward from a top surface of the dielectric core filler to the top of the stack; and n+ doped silicon above the dopant stopper liner, the n+ doped silicon conforms to the dopant stopper liner, and a top surface of the n+ doped silicon is at the top of the stack.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

What is claimed is:
1. A method for fabricating a contact in a memory device, comprising:
forming a vertically-extending memory hole in a stack, the stack comprising alternating control gate layers and dielectric layers;

providing a channel film in the vertically-extending memory hole, a central void in the vertically-extending memory hole is formed within the channel film;

providing a dielectric core filler in the central void;

forming a void in the vertically-extending memory hole, the forming the void comprises etching back the dielectric core filler to provide an etched back dielectric core filler;

providing a dopant stopper liner in the void, the dopant stopper liner is conductive and extends upward from a top surface of the etched back dielectric core filler to a top of the stack;

providing n+ doped silicon in the void, above the dopant stopper liner, the n+ doped silicon conforms to the dopant stopper liner;

providing a conductive via which extends above the stack, the conductive via has a bottom surface which rests on a top surface of the n+ doped silicon, wherein the channel film and the dielectric core filler extend to a top of the vertically-extending memory hole before the forming the void, and at least a portion of the channel film remains at the top of the stack after the etching back of the dielectric core filler; and performing ion implantation which implants ions at a top of the n+ doped silicon and at a top of the at least the portion of the channel film.

2. The method of claim 1, wherein:
the dielectric core filler is etched back to a height of a topmost control gate layer of the control gate layers in the stack, and the topmost control gate layer is a select gate layer.

3. The method of claim 1, wherein:
the dopant stopper liner comprises metal.

4. The method of claim 1, wherein:
the dopant stopper liner comprises polysilicon doped with carbon at a concentration of $10^{21}$ to $10^{22}$ atoms per $cm^3$.

5. The method of claim 1, wherein:
the n+ doped silicon is deposited as amorphous silicon.

6. The method of claim 1, further comprising:
performing a heating step to activate the implanted ions in the n+ doped silicon and in the at least the portion of the channel film.

7. The method of claim 6, wherein:
the performing the heating step comprises performing rapid thermal annealing at 900-1000 C for 10-30 seconds.

8. The method of claim 1, wherein the providing the conductive via comprises:
providing an etch stop layer above the stack including above the top surface of the n+ doped silicon;
providing an oxide layer above the etch stop layer;
patterning the oxide layer and then the etch stop layer using different etch chemistries to form a pillar-shaped void above the vertically-extending memory hole; and
providing a conductive material in the pillar-shaped void above the vertically-extending memory hole.

9. The method of claim 1, wherein:
the conductive via connects the n+ doped silicon to a metal bit line.

* * * * *